(12) United States Patent
Francis et al.

(10) Patent No.: US 11,056,625 B2
(45) Date of Patent: Jul. 6, 2021

(54) CLEAR COATING FOR LIGHT EMITTING DEVICE EXTERIOR HAVING CHEMICAL RESISTANCE AND RELATED METHODS

(71) Applicant: Cree, Inc., Durham, NC (US)

(72) Inventors: Aaron James Francis, Apex, NC (US); Michael J. Bergmann, Atlanta, GA (US)

(73) Assignee: CreeLED, Inc., Newark, CA (US)

( * ) Notice: Subject to any disclaimer, the term of this patent is extended or adjusted under 35 U.S.C. 154(b) by 0 days.

(21) Appl. No.: 15/899,196

(22) Filed: Feb. 19, 2018

(65) Prior Publication Data

US 2019/0259925 A1 Aug. 22, 2019

(51) Int. Cl.
| | | |
|---|---|---|
| H01L 33/56 | (2010.01) |
| H01L 33/58 | (2010.01) |
| H01L 33/60 | (2010.01) |
| H01L 33/50 | (2010.01) |
| C09D 143/04 | (2006.01) |
| C09D 133/10 | (2006.01) |
| C09D 133/08 | (2006.01) |
| C09D 5/08 | (2006.01) |

(52) U.S. Cl.
CPC ............ *H01L 33/56* (2013.01); *C09D 5/08* (2013.01); *C09D 133/08* (2013.01); *C09D 133/10* (2013.01); *C09D 143/04* (2013.01); *H01L 33/502* (2013.01); *H01L 33/58* (2013.01); *H01L 33/60* (2013.01); *H01L 2933/005* (2013.01)

(58) Field of Classification Search
CPC ...... C09D 133/08; C09D 5/08; C09D 133/10; C09D 143/04; H01L 33/60; H01L 33/58; H01L 33/56; H01L 33/502; H01L 2933/005
USPC .................................................. 257/98, 438
See application file for complete search history.

(56) References Cited

U.S. PATENT DOCUMENTS

| | | |
|---|---|---|
| 4,946,547 A | 8/1990 | Palmour et al. |
| 5,200,022 A | 4/1993 | Kong et al. |
| RE34,861 E | 2/1995 | Davis et al. |
| 6,452,325 B1 | 9/2002 | Dupont |
| 7,252,786 B2 | 8/2007 | Alfonso et al. |
| 7,572,479 B2 | 8/2009 | Nolan et al. |
| 8,152,586 B2 | 4/2012 | Nolan |
| 8,697,458 B2 | 4/2014 | Nolan et al. |
| 9,236,536 B2 | 1/2016 | Nolan et al. |
| 2008/0057260 A1* | 3/2008 | Buchhauser ......... H01L 51/524 428/76 |
| 2010/0033079 A1 | 2/2010 | Nolan |
| 2010/0270574 A1 | 10/2010 | Nolan et al. |
| 2010/0270582 A1 | 10/2010 | Nolan et al. |

(Continued)

FOREIGN PATENT DOCUMENTS

WO 2017189395 A1 11/2017

*Primary Examiner* — Hrayr A Sayadian
(74) *Attorney, Agent, or Firm* — Myers Bigel, P.A.

(57) ABSTRACT

Light emitting devices and components having excellent chemical resistance and related methods are disclosed. In one embodiment, an LED device or package with an encapsulant material or lens disposed over at least a portion of the LED device or package and a poly(methyl) acrylate-silicon containing barrier coating at least partially disposed over the encapsulant or the lens provides corrosion protection to corrodible metals and/or moisture protection to moisture sensitive components.

22 Claims, 11 Drawing Sheets

(56) References Cited

U.S. PATENT DOCUMENTS

| | | |
|---|---|---|
| 2011/0210364 A1 | 9/2011 | Nolan et al. |
| 2012/0294011 A1 | 11/2012 | Cattoni et al. |
| 2013/0020590 A1 | 1/2013 | Lin et al. |
| 2013/0161658 A1* | 6/2013 | Lin .................. H01L 33/60 257/88 |
| 2013/0214298 A1 | 8/2013 | Lin et al. |
| 2014/0054632 A1 | 2/2014 | Nolan et al. |
| 2014/0254135 A1 | 9/2014 | Nolan et al. |
| 2015/0295153 A1* | 10/2015 | Kuramoto ............ H01L 33/508 257/98 |
| 2017/0307204 A1 | 10/2017 | Cattoni |
| 2017/0373125 A1* | 12/2017 | Youk .................. H01L 27/3276 |
| 2019/0259925 A1* | 8/2019 | Francis ................ C09D 133/10 |

\* cited by examiner

CLEAR COATING FOR LIGHT EMITTING DEVICE EXTERIOR HAVING CHEMICAL RESISTANCE AND RELATED METHODS

TECHNICAL FIELD

The subject matter herein relates generally to light emitting devices, components and methods. More particularly, the subject matter herein relates to coatings with improved chemical resistance to chemical vapors or gases that can adversely affect the brightness and reliability of such devices for light emitting devices, components, methods and devices provided therefrom.

BACKGROUND

Light emitting diodes (LEDs), can be utilized in light emitting devices or packages for providing white light. Conventional LED devices or packages can incorporate components such as metallic traces or mounting surfaces, which can become tarnished, corroded, or otherwise degraded when exposed to various undesirable chemicals and/or chemical vapors, even when embedded or otherwise "encapsulated". Silver (Ag) is used in LED devices and packages because of its superior reflectivity for visible wave-lengths and relative low cost. However, silver is susceptible to corrosion/oxidation. While gold (Au) has superior corrosion properties compared to silver, Au typically makes the LED about 15% dimmer than silver depending on the package configuration. In addition, gold (Au) has a significant cost effect on the device compared to silver. Moreover, use of gold does not protect the device and its other, non-gold components from ingress of the undesirable chemicals and/or chemical vapors and any effect that such ingress can have on performance or longevity of the device. Such chemicals and/or chemical vapors can enter conventional LED devices, for example, by permeating the encapsulant disposed over such components or through gaps in the substrate/LED chip structure.

Undesirable chemicals and/or chemical vapors can contain sulfur, sulfur-containing compounds (e.g., sulfides ($H_2S, CH_3SH$), sulfites, sulfates, $SO_x$), chlorine and bromine containing complexes, nitric oxide or nitrogen dioxides (e.g., $NO_x$, $N_xO_y$), water vapor, and oxidizing organic vapor compounds, which are present in varying amounts in the environment. These chemicals and/or chemical vapors can permeate the encapsulant and physically and/or chemically degrade various corrodible metal components and/or moisture sensitive components or materials within the LED device. Physical or chemical degradation includes corroding, oxidizing, hydration, hydrolysis, decomposition, darkening, and/or tarnishing such corrodible metal components or moisture sensitive materials. Such degradation can adversely affect brightness, reliability, and/or thermal properties of conventional LED devices over time, and can further adversely affect the performance of the devices during operation. For example, a major failure mechanism of LEDs is a change in forward voltage in the component, brought on by increased internal resistance, e.g. diminished connectivity between a wire bond and a mounting surface caused by chemical corrosion. Such degradation is accelerated during operation of the device under its normal operating conditions.

SUMMARY

In a first embodiment, an LED device is provided, the LED device comprising one or more LED chips; an encapsulant material or lens disposed over at least a portion of the one or more LED chips; and a barrier coating at least partially disposed over the encapsulant or the lens.

In one example, the barrier coating at least partially comprises a polyacrylate-silicon containing material, a polymethylacrylate-silicon containing material, or mixtures thereof.

In another example, alone or in combination with any one of the previous examples, the barrier coating is directly disposed on the encapsulant material or lens.

In another example, alone or in combination with any one of the previous examples, the LED device comprises one or more metal components susceptible to corrosion. In another example, alone or in combination with any one of the previous examples, the one or more metal components is aluminum, copper, silver, or alloys thereof. In another example, alone or in combination with any one of the previous examples, the LED device comprises one or more reflective metal components, the one or more reflective metal components is aluminum, silver, or alloys thereof.

In another example, alone or in combination with any one of the previous examples, the LED device comprises an element or compound sensitive to water vapor. In another example, alone or in combination with any one of the previous examples, the moisture sensitive element or compound is a phosphor. In another example, alone or in combination with any one of the previous examples, the phosphor is a potassium fluorosilicate phosphor.

In another example, alone or in combination with any one of the previous examples, the barrier coating is represented by Formula (1):

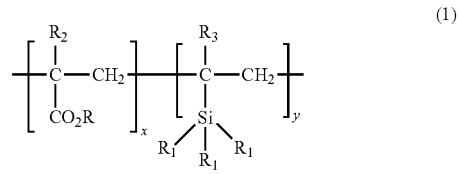

(1)

where R is methyl or ethyl or a $C_3$-$C_6$ straight or branched alkyl; each $R_1$ is, independently, hydrogen, hydroxyl, alkyl, phenyl, or vinyl, with the proviso that at least one $R_1$ is hydrogen, hydroxyl, or vinyl; $R_2$ and $R_3$ are, independently, hydrogen, methyl, or ethyl; and x and y represent molar amounts of monomer, where $0<x+y\leq1$, and $y>0$ arranged as a block copolymer, a random copolymer, or a silane end-terminated polymer.

In another example, alone or in combination with any one of the previous examples, the barrier coating is a mixture of polymer structures represented by Formula (1), where at least one of the polymer structures represented by Formula (1) of the mixture has $R_1$=hydrogen and at least one of the polymer structures represented by Formula (1) of the mixture has $R_1$=vinyl. In another example, alone or in combination with any one of the previous examples, the barrier coating is a polymer structure represented by Formula (1), where $R_1$=hydroxyl.

In another embodiment a method of reducing or preventing corrosion of corrodible metal components of an LED device is provided, the method comprising: applying a barrier coating to at least a portion of an encapsulant or lens of an LED device, the LED device having at least one corrodible metal portion; and reducing or preventing permeation of chemicals capable of corroding the corrodible metal portion. In one aspect, the corrodible metal is aluminum, copper, silver, or alloys thereof.

In one example, the barrier coating at least partially comprises a polyacrylate-silicon containing material, a polymethylacrylate-silicon containing material, or mixtures thereof, represented by Formula (1):

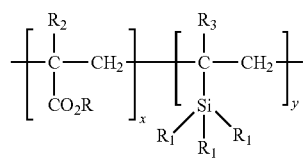

where R is methyl or ethyl or a $C_3$-$C_6$ straight or branched alkyl; each $R_1$ is, independently, hydrogen, hydroxyl, alkyl, phenyl, or vinyl, with the proviso that at least one $R_1$ is hydrogen, hydroxyl, or vinyl; $R_2$ and $R_3$ are, independently, hydrogen, methyl, or ethyl; and x and y represent molar amounts of monomer, where $0<x+y\leq 1$, and $y>0$ arranged as a block copolymer, a random copolymer, a graft copolymer, or a silane end-terminated poly(meth)acrylate.

In another example, alone or in combination with any one of the previous examples, the barrier coating is applied directly to the encapsulant or the lens.

In another example, alone or in combination with any one of the previous examples, the method further comprises reducing or preventing a change of forward voltage (Vf) during operating conditions of the LED device. In another example, alone or in combination with any one of the previous examples, the method further comprises reducing or preventing a change of luminosity during operating conditions of the LED device, or reducing or preventing a change of color shift during operating conditions of the LED device. In another example, alone or in combination with any one of the previous examples, the corrodible metal portion is silver, aluminum, copper, or alloys thereof.

In another example, alone or in combination with any one of the previous examples, the method further comprises reducing or preventing corrosion of one or more reflective metal components susceptible to corrosion the one or more reflective metal components selected from aluminum, silver, or alloys thereof.

In another embodiment, a method of reducing or preventing degradation of a moisture sensitive component of an LED device is provided, the method comprising: applying a barrier coating to at least a portion of an encapsulant or lens of an LED device or package having a moisture vapor sensitive phosphor; reducing or preventing permeation of an amount of moisture vapor capable of degrading the moisture sensitive component; and reducing or preventing degradation of the moisture sensitive component during transport, storage, or under operating conditions of the LED device or package. In one aspect, the moisture sensitive component is a phosphor.

In one example, the barrier coating at least partially comprises a polyacrylate-silicon containing material, a polymethylacrylate-silicon containing material, or mixtures thereof, represented by Formula (1):

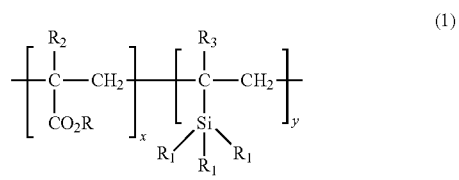

where R is methyl or ethyl or a $C_3$-$C_6$ straight or branched alkyl; each $R_1$ is, independently, hydrogen, hydroxyl, alkyl, phenyl, or vinyl, with the proviso that at least one $R_1$ is hydrogen, hydroxyl, or vinyl; $R_2$ and $R_3$ are, independently, hydrogen, methyl, or ethyl; and x and y represent molar amounts of monomer, where $0<x+y\leq 1$, and $y>0$ arranged as a block copolymer, a random copolymer, a graft copolymer, or a silane end-terminated poly(meth)acrylate.

In another example, alone or in combination with any one of the previous examples, the barrier coating is applied directly to the encapsulant or the lens.

In another example, alone or in combination with any one of the previous examples, the method further comprises reducing or preventing a change of luminosity during operating conditions of the LED device or package, reducing or preventing a change in forward voltage during operating conditions of the LED device or package, or reducing or preventing a change of color shift during operating conditions of the LED device or package.

In another example, alone in combination with any one of the previous examples, the moisture sensitive component is a potassium fluorosilicate phosphor.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
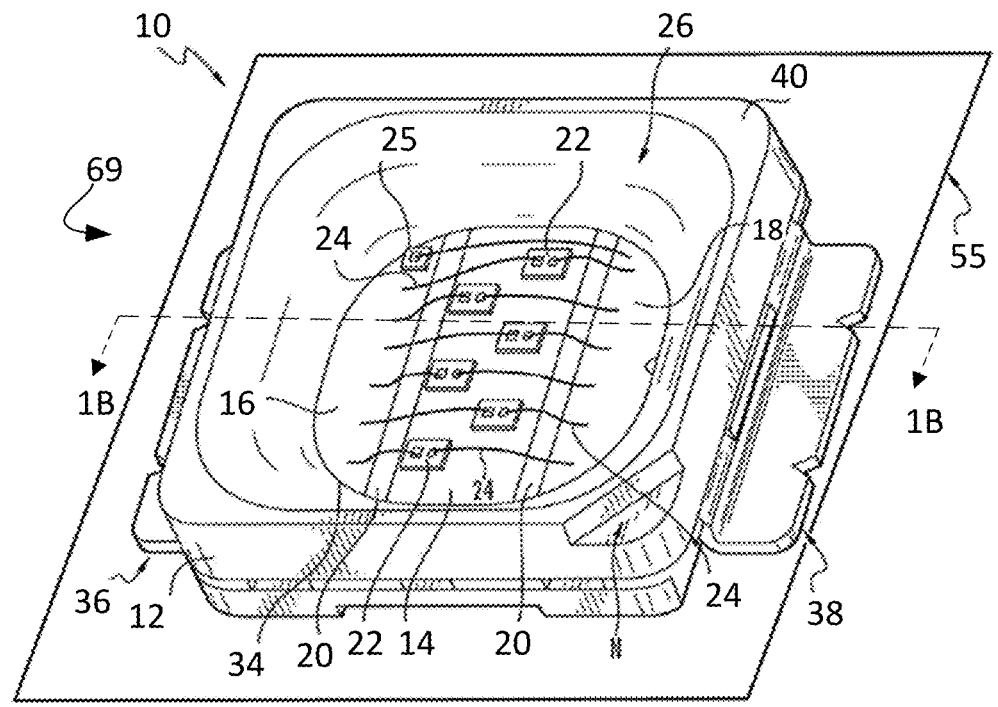
FIG. 1A is a top perspective view of a first embodiment of a light emitting diode (LED) device according to the disclosure herein.

Diffusion of gases or liquids into LED components through an encapsulant or package material (e.g., the front side or backside of a polymer leadframe-PCB) leads to corrosion of corrodible metals (e.g., silver, aluminum, copper) and degradation of moisture sensitive materials (e.g., certain phosphors) contained within the package. To address this issue, the present disclosure provides a barrier coating and a barrier coating application process suitable for LED lamps, ceramic or polymer packages and ceramic or polymer leadframes.

Silver (Ag) is an excellent reflective material, and a need remains for reducing or preventing undesirable chemicals and/or chemical vapors from reaching and subsequently degrading Ag metal components within LED packages and LED devices, allowing the use of Ag as a reflector material for high power and/or high brightness applications. Barrier coatings and methods described herein provide ease of manufacture and increasing device reliability and performance of LED packages and LED devices containing Ag portions. Notably, barrier coatings and methods herein can reduce or prevent degradation of optical and other performance properties of devices or packages incorporating silver (Ag) or Ag plated components by reducing or prevent permeation of chemical vapors capable of tarnishing of the Ag or Ag-plated components.

Furthermore, barrier coatings and methods herein disclosed reduce or prevent moisture vapor permeation in LED packages and devices. As a result, the barrier coatings and methods herein disclosed reduce or prevent degradation of moisture sensitive components in the LED package and device, such as phosphors. As used herein, moisture sensitive components are inclusive of elements and compounds present in an LED device that undergo a physical or chemical change upon exposure to water vapor. An example of a moisture sensitive component is a phosphor present in an LED device that undergoes a physical, functional or chemical change, e.g., in its chemical composition, degree of hydration, and/or its emission or excitation profile, upon exposure of the LED device to moisture or water vapor. Such a physical, functional or chemical change of the moisture sensitive component may be instantaneous or occur at any time during the expected lifetime of a LED device.

The LED package may be a plastic LED with metal leadrame, a ceramic or metal chip-on-board (COB), or a ceramic substrate surface-mounted-device (SMD) LED. Described barrier coatings and methods can be used and applied to create chemically resistant surface mount device SMD or COB type of LED devices of any size, thickness, and/or dimension. Described barrier coatings and methods can be used and applied to create moisture vapor resistant surface mount device SMD or COB type of LED devices of any size, thickness, and/or dimension. Devices, components, and methods described herein can advantageously be used and adapted within any style of LED device, for example, devices including a single LED chip, multiple chips, and/or multi-arrays of LEDs and/or devices incorporating different materials for the body or submount such as plastic, ceramic, glass, aluminum nitride (AlN), aluminum oxide ($Al_2O_3$), printed circuit board (PCB), metal core printed circuit board (MCPCB), and aluminum panel-based devices. Described barrier coatings and methods can be used and applied to create moisture vapor resistant LED devices and packages.

In one example, a barrier coating is applied to the exterior of an LED component that contains and encapsulant or a lens. The chemical composition of the barrier coating reduces intrusion of external chemical vapors (primarily gases, e.g., sulfur-containing gases, water vapor, and other small molecules as well), thereby affording corrosion protection and moisture vapor protection for the materials inside the component and advantageously increase the lifecycle of the device in a number of ways.

In one example, the barrier coating provides protection of certain corrodible metals within the component from oxidation (e.g., corrosion) and reactions with compounds found in the ambient environment that are capable of covalently reacting and altering the surface of the LED components, especially such corrodible metal surfaces. For example, and while not being held to any theory, sulfur and its compounds reacts with Ag and Ag plating and becomes $Ag_2S$. As the $Ag_2S$ itself is not conducting, high Vf and/or fully open Vf state can result. Failure of the wire bond to the Ag package also can result under such conditions. In one example the barrier coating provides a reduction or prevention of corrosion of corrodible metal surfaces during operation of the LED device.

In one example, the barrier coating is effective in reducing or preventing silver corrosion and avoiding increased internal electrical resistance that can occur with such silver corrosion. The barrier coating protects such Ag components from an array of contaminates, including oxides of sulfur and acids derived therefrom, hydrogen sulfide, other sulfur-containing gases, oxygen, water, water vapor, nitrogen oxides and acids derived therefrom, other gaseous oxides and acids derived therefrom, and other contaminates originating from outside the component.

In one example, the barrier coating is effective in reducing or preventing hydrolytic degradation of moisture sensitive chemicals present within with LED devices. The present barrier coating is effective in reducing or preventing degradation of such moisture sensitive chemicals within the LED device when exposed to high humidity (e.g., >85% relative humidity) environments. The barrier coating provides protection for such phosphors from moisture vapor and other contaminates originating from outside the component. The barrier coating provides reduction or elimination of moisture-related degradation of the moisture sensitive phosphor.

The presently disclosed barrier coating and process provides for excellent coating reliability that is significantly improved compared to conventional methods, where in conventional coatings and methods an encapsulant material is localized in proximity of the LED. In contrast, remotely positioning the barrier coating from the LED and/or the encapsulant improves the reliability and lifetime of the barrier coating by reducing exposure of the barrier coating to heat and UV light and light flux, among other things, compared to such conventional encapsulant coatings. In addition, the barrier coating imparts little or no adverse consequences to component performance (lumen flux, color, forward voltage ($V_f$), etc.)

The presently disclosed barrier coating and process provides for a complementary process with that of conventional encapsulation methods and for other conventional coatings dispensed onto a COB package, SMD package floor and/or LED chip and/or the COB/SMD package encapsulated with conventional silicone, epoxy, or other encapsulant material. The presently disclosed barrier coating is used alone or in combination with conventional coatings dispensed directly onto a COB/SMD package floor and/or LED chip and/or the COB/SMD package encapsulated with conventional silicone, epoxy, or other encapsulant material.

As will be appreciated by those of skill in the art, references to a structure being formed "on" or "above" another structure or portion contemplates that additional structure, portion, or both may intervene. Similarly, it will be understood that when an element is referred to as being "connected", "attached", "coupled" to another element, it can be directly connected, attached, or coupled to the other element, or intervening elements may be present. In contrast, when an element is referred to as being "directly connected", "directly attached", "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Similarly, it will be understood that when an element is referred to as being "directly above" or "directly on" another element, no intervening elements are present.

Unless the absence of one or more elements is specifically recited, the terms "comprising," including," and "having" as used herein should be interpreted as open-ended terms that do not preclude the presence of one or more elements.

Light emitting devices according to embodiments described herein can comprise group III-V nitride (e.g., gallium nitride (GaN)) based light emitting diodes (LEDs) or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN.

One or more LEDS can be at least partially coated with one or more phosphors. The phosphors can absorb a portion of the LED light and emit a different wavelength of light such that the LED device or package emits a combination of light from each of the LED and the phosphor. In one example, the LED device or package emits what is perceived as white light resulting from a combination of light emission from the LED chip and the phosphor.

In one example, the LED contains a moisture sensitive component. As used herein, the moisture sensitive component is inclusive of elements and compounds that are susceptible to physical, functional, or chemical change during transport, storage, or under operating conditions of the LED device upon exposure to moisture or water vapor. In one example, the moisture sensitive component is a metal, ceramic, polymer, or an organic, inorganic, or organic-inorganic compound present in the LED device.

In one example, the moisture sensitive component is a moisture sensitive phosphor. In one example, the moisture sensitive component is a moisture sensitive potassium fluorosilicate phosphor. In another example, the moisture sensitive component is a potassium fluorosilicate phosphor ($K_2SiF_6$) doped with a transition metal. The potassium fluorosilicate phosphor (or one doped with a transition metal) can be used in combination with one or more other phosphors or lumiphors, so as to provide a desired emission spectrum from the LED device or package.

With the potassium fluorosilicate phosphor (or one doped with a transition metal), some percentage of LED packages have been observed to undergo rapid and serve degradation (<500 hours) in high humidity (>85% RH) environments, with pitting of the package floor. While not to be held to any theory, it is postulated that fluoride ($F^-$) from the potassium fluorosilicate phosphor becomes mobile upon exposure to moisture that has penetrated the device, the fluoride interacting with Ag to open up pits in the Ag layer, through which copper (Cu) can migrate to the surface. The present barrier coating, by reducing or preventing moisture vapor transport, mitigates this mode of device failure.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations. As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both.

Figure 1B:
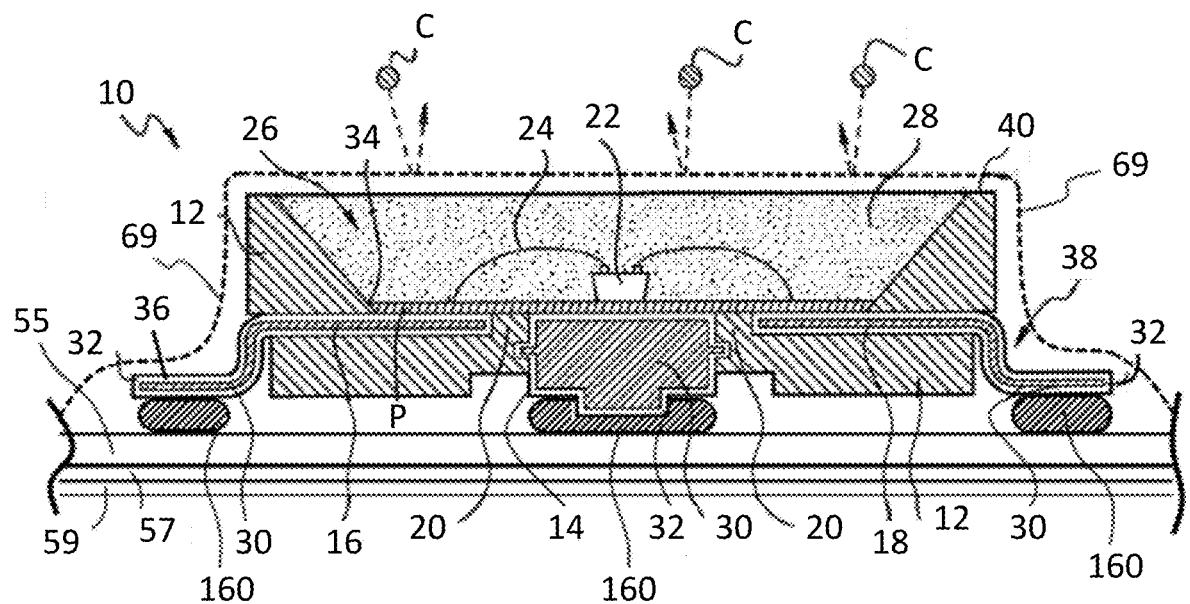
FIG. 1B is a sectional view of FIG. 1A along section 1B-1B, according to the disclosure herein.

Referring now to FIGS. 1A, 1B illustrate top and cross-sectional views, respectively, of one example of a light emitting diode (LED) package or device, generally designated 10 having a barrier coating 69. In one aspect, LED device 10 can comprise a surface mount device (SMD) comprising a body 12 with top surface 40, which can be molded or otherwise formed about a leadframe. SMD types of LED devices can be suitable for general LED illumination applications, such as indoor and outdoor lighting, automotive lighting, and preferably suitable for high power and/or high brightness lighting applications. The subject matter disclosed herein can be suitably adapted for application within a wide range of SMD type LED device designs, not limited to dimensional and/or material variations.

Notably, devices, components, and methods disclosed herein can maintain the brightness of device 10 even in the presence of harmful chemicals, chemical vapors, or complexes by provision of a protective barrier or barrier coating 69, configured to prevent such harmful chemicals, chemical vapors, or complexes from tarnishing and/or otherwise degrading components within device 10. In one aspect, body 12 can be disposed about a leadframe comprising a thermal element 14 and one or more electrical elements, for example, first and second electrical elements 16 and 18, respectively. That is, thermal element 14 and electrical elements 16 and 18 can be collectively referred to as a "leadframe" and can be singulated from a sheet of leadframe components (not shown). A corner notch, generally designated N can be used for indicating electrical polarity of first and second electrical elements 16 and 18. First and second electrical elements 16 and 18 can comprise a corrodible reflective material that is electrically and/or thermally conductive such as Al, Ag, Cu metal or metal alloy. In one aspect, thermal element 14 can be electrically and/or thermally isolated one and/or both of first and second electrical elements 16 and 18 by one or more isolating portions 20 of the body.

One or more LED chips or LEDs 22 can be mounted over thermal element 14 using any suitable die attach technique(s) and/or material(s), for example only and not limited to die attach adhesive (e.g., silicone, epoxy, or conductive silver (Ag) epoxy) or a metal-to-metal die attach technique such as flux or no-flux eutectic, non-eutectic, or thermal compression die attach.

LEDs 22 can electrically communicate with one and/or both first and second electrical elements 16 and 18 via one or more electrical connectors such as electrically conductive wire bonds 24. In one example, LED 22 with two electrical contacts (e.g., upper surface) are electrically connected to two corrodible metal or metal alloy electrical components (e.g., 16 and 18) via wire 24 electrically coupled at one end to LED 22 and at the other end to corrodible metal or metal alloy electrical components 16 and 18 (not shown). However, LEDs 22 having one electrical contact on the upper surface that is electrically connected with a single electrical element is also contemplated. Any type or style of LED 22 using corrodible metal or metal alloy electrical components can be used in device 10.

Wire bonds 24 or other electrical attachment connectors and related methods can be adapted to communicate, transmit, or convey an electrical current or signal from electrical elements 16 and 18 to one or more LEDs 22 thereby causing illumination of the one or more LEDs 22. Thermal element 14 and/or first and second electrical elements 16 and 18, respectively, can be coated, plated, deposited, or otherwise layered with a reflective material (FIG. 1B), such as, for example and without limitation, Ag or a Ag-containing alloy for reflecting light from the one or more LEDs 22.

Body 12 can comprise any suitable material molded or otherwise disposed about thermal element 14 and/or first and second elements 16 and 18, respectively. In one aspect, body 12 can comprise a ceramic material such as a low temperature co-fired ceramic (LTCC) material, a high temperature co-fired ceramic (HTCC) material, alumina, aluminum nitride (AlN), aluminum oxide ($Al_2O_3$), glass, and/or an Al panel material. In other aspects, body 12 can comprise a molded plastic material such as polyamide (PA), polyphthalamide (PPA), polycyclohexylenedimethylene terephthalate (PCT); liquid crystal polymer (LCP), epoxy molding compound (EMC), or silicone.

At least one electrostatic discharge (ESD) protection device 25 can be disposed within device 10 and can be electrically connected to electrical elements 16 and 18 reverse biased with respect to LEDs 22. ESD device 25 can protect against damage from ESD within device 10.

Still referring to FIGS. 1A and 1B, body 12 of device 10 can comprise a cavity, generally designated 26, for example, a reflector cavity optionally coated with a reflective material such as silver, for reflecting light from the one or more LEDs 22. As FIG. 1B illustrates, cavity 26 can be filled at least partially or completely with a filling material, such as an encapsulant 28. Encapsulant 28 can optionally comprise one or more phosphor materials adapted to emit light of a desired wavelength when activated by light emitted from the one or more LEDs 22. Thus, in one aspect, device 10 can emit light having a desired wavelength or color point that can be a combination of light emitted from phosphors disposed in encapsulant 28 and from the light emitted from one or more LEDs 22.

In one aspect, thermal element 14 and first and second electrical elements 16 and 18 can comprise an inner portion 30 and an outer portion 32. In one aspect, inner portion 30 and outer portion 32 can comprise electrically and/or thermally conductive materials. Outer portion 32 may be applied such that it entirely surrounds inner portion 30 as shown, or in other aspects outer portion 32 can optionally plate, coat, or comprise a layer over a single surface or two or more surfaces of portion 30.

In one aspect, device 10 can comprise a highly reflective angled portion 34, or other feature, or polymer reflective surface containing Ag, or layer of Ag, on such reflective angled surface, for maximizing light output from device 10 and/or for assisting in heat dissipation by conducting/reflecting heat away from the one or more LEDs 22. Device 10 can also comprise a Ag-containing alloy instead of pure Ag, and such alloy can contain other metals such as titanium (Ti) or nickel (Ni) that provide reflectivity of the LED light.

First and second electrical elements 16 and 18 can extend from one or more lateral sides of body 12 and form one or more external tab portions, generally designated 36 and 38 and can be electrically coupled to substrate 55 via solder 160, for example. Inner portion 30 of conductive tab 36 can comprise a corrodible metal or metal alloy such as silver, (Ag), copper (Cu) substrate or Ag-alloy or Cu-alloy. In one aspect, an optional layer of material (not shown) can be disposed between inner portion 30 and outer portion 32 of tab 36, such as a layer of Ni for providing a barrier between the Ag and Cu, thereby preventing defects caused by migratory Cu atoms, such as a defect commonly known as "red plague".

In other aspects, outer portion 32 can be directly attached to and/or directly coat inner portion 30. Outer portion 32 of tab 36 can be configured to reflect light emitted from the one or more LEDs 22 thereby improving optical performance of device 10.

In one aspect, an optional nonconductive layer "P" can be used. As shown in FIG. 1B, the layer P can be positioned on floor of cavity 26. The layer P can also be discretely deposited on one or more components of the LED device 10, for example, using masking or robotic dispensing. The layer P can provide reflective functionality and/or provide additional chemical vapor and/or moisture barrier functionality to the LED device 10. In one example, barrier coating 69 is used in combination with the layer P.

The layer P can be the same material as the barrier coating or a different material. In one example, layer P comprises a transparent polysiloxane polymer, a polysiloxane copolymer, a polysiloxane-polysilazane copolymer, a polyurethane, or mixtures thereof. The layer P can function as a transparent polymer matrix. The layer P can function as a dielectric, transparent polymer matrix. Examples of such transparent polymer matrix materials include, but are not limited to, polysiloxanes, polysilazanes, or polysiloxane-polysilazne copolymers, or are polymers disclosed in co-assigned United States Patent Application Publication No. 2013/0020590A1, filed Dec. 1, 2011, the content of which is incorporated herein by reference. In another aspect, optional layer P comprises a deposited coating of $SiO_2$ or silicon nitride (SiN).

In one example, layer P is a transparent polymer matrix that comprises an additional filler material, such as particles, that change the reflective properties or index of refraction of the layer. The particles can be of a suitable average particle size range, desired index of refraction and/or particle size distribution or mixture thereof to reflect the one or more wavelengths of light produced by one or more of the LED chips 22 of the device. In one example, the layer P comprises particles of titanium dioxide, zinc oxide, or other reflective or refractive material. In one example, layer P is a transparent polymer matrix that does not contain particles. The layer P can comprise combinations of layers P, with or without reflective particles, e.g., arranged in one or more layers in any order in the LED device. In one example, the arrangement of layer P, or the arrangement of combinations of layer P, is configured to reflect light depending on the incident angle of the LED chip. Such layer P or combinations of layer P can be arranged essentially vertically in equal layer thickness or unequal layer thickness.

The layer P is remotely positioned from barrier coating 69, for example, the lens or the encapsulant is positioned between the layer P and barrier coating 69. In another example, the layer P is positioned or deposited on at least a portion of one or more reflective components about the device 10, and the barrier coating 69 is remotely positioned from the layer P. In another example, the layer P is positioned about or directly deposited on at least a portion of corrodible components about the device 10, and barrier coating 69 is remotely positioned from the layer P.

In one example, layer P comprises an amount of reflective material suitable to reflect the light produced by one or more of the LED chips 22 of the device. In one example, the layer P comprises titanium dioxide, zinc oxide, or other reflective or refractive material. In one example, the layer P is deposited on at least a portion of reflective components of the device 10. In another example, layer P is directly deposited on at least a portion of the reflective components. In another example, layer P is directly deposited on all of the reflective portions of the device. In one example, the reflective portions of the device coated with the layer P are conductive and/or are energizable components of the device.

In one example, layer P is deposited on at least a portion of one or more corrodible components of the device, such as corrodible metal components. In one example, layer P is deposited on corrodible, reflective components, for example silver (Ag), aluminum (Al) or Ag or Al alloys, of the LED device or the LEDs thereof. In one example, the lens or the encapsulant is positioned between barrier coating 69 and the layer P deposited on (or directly deposited on) the reflective and/or corrodible silver (Ag), aluminum (Al) or Ag or Al alloy portions the device.

Layer P, if used, is deposited at a thickness suitable to reduce or eliminate exposure of corrodible metal components from chemical vapors or moisture vapor. Thus, in one example, the layer P is deposited on one or more corrodible components on, in, or in proximity to the substrate or LED chips of the LED device so as to reduce or prevent corrosion by reducing or preventing permeation of chemical vapors or moisture vapor. In another example, the layer P is deposited on at least a portion of corrodible, reflective components, for example Ag, Al, or Ag or Al alloys positioned about the device, but the layer P is not deposited on the entirety on the floor of the substrate or the entirety of the device.

Substrate 55 can include layers 57, 59 for heat dissipation and electrical insulation. Tab portions 36 and 38 can bend to form one or more lower mounting surfaces such that device 10 can be mounted to an underlying substrate. Tab portions 36 and 38 can outwardly bend away from each other or inwardly bend towards each other thereby adapting either a J-bend or gull-wing orientation as known in the art. However, any configuration of external tabs 36 and 38 is contemplated.

In some aspects, encapsulant 28 can provide physical protection against foreign solids and liquids, but may not provide adequate protection against chemical vapors, e.g., airborne chemical vapors such as sulfur, hydrogen sulfide, oxides of sulfur and acids derived therefrom, oxides of nitrogen and acids derived therefrom, oxygen, or moisture, which can oxidize, tarnish or otherwise degrade corrodible metal portions and/or outer portion 32 where outer portion comprises a corrodible metal such as copper (Cu) or silver (Ag) (e.g., pure Ag, Ag-alloys or Ag plating) and/or moisture sensitive components. One or both of these events can decrease the brightness of device 10, among other things.

Undesirable chemical gases or vapors, alone or in combination with water (as liquid or vapor), which are symbolized by "C" in FIG. 1B, which otherwise can permeate encapsulant 28 and potentially interact with outer portion 32 (inclusive of surface) of elements, for example, by tarnishing such elements thereby resulting in degradation to optical, physical, electrical, and/or thermal properties such as a loss in brightness output and the noticeable darkening of surfaces such as the cavity floor or reflective angled walls 34 are reduced or prevented using the materials and methods herein disclosed.

Undesirable chemical vapors or "C" that otherwise can permeate the encapsulant 28 and potentially adversely affect outer portion 32 are reduced or prevented from interacting with surfaces within the device as taught in the present disclosure. Notably, the current subject matter optimizes the chemical resistance of device 10 by incorporating a barrier coating 69 serving as a protective barrier or barrier layer disposed over one or more outer surfaces of device 10, such as the encapsulant 28, within device 10, and/or over components of device 10 to prevent chemical vapors "C" from reaching, interacting with, and/or adversely affecting components such as Ag-containing outer portion 32 of thermal and electrical and optical elements 14, 16, 18 and any other Ag material or components of body 12.

As FIG. 1B illustrates, in one example, barrier coating 69 can be disposed over encapsulant 28 along body 12 as shown. In another example, barrier coating 69 can be directly disposed over encapsulant 28 and conforming along body 12, as shown.

Chemical vapors "C", e.g., water vapor, can degrade certain components (e.g., potassium fluorosilicate-based phosphors) and result in a change of output color. The present barrier coating improves the moisture barrier protection of device 10 such that moisture vapor is reduced or prevented from permeating the barrier coating 69, and thus provides protection to moisture sensitive components within device 10 thereby minimizing moisture-based degradation to moisture sensitive phosphors, and further reducing or preventing any loss in brightness from device 10.

Barrier coating 69 can be directly and/or indirectly disposed over other vulnerable components within devices described herein, such as located directly or indirectly over Ag or Ag-alloy containing components within the encapsulant or LED device or package, as well as interfaces between the leadframe and PCB. Barrier coating 69 can be adapted for application to a variety of surfaces of components within LED devices.

In one example, barrier coating 69 can be directly applied to portions of the encapsulant surface or lens material, including underfills, on or over wires, wire bonds 24, wire bond balls (e.g., ball formed where wire 24 attaches to LED chip 22), and on surfaces of the LED housing or body.

In another example, barrier coating 69 can be applied directly over portions of a ceramic or plastic body of LED device, for example, isolating portions 20 of body 12 (FIG. 1B). Barrier coating 69 can be directly applied over contiguous portions of a ceramic or plastic body of LED device and the leadframe in a sealing engagement to provide a reduction or prevention of chemical vapor or moisture vapor transport from one or all sides of the device.

Figure 2A:
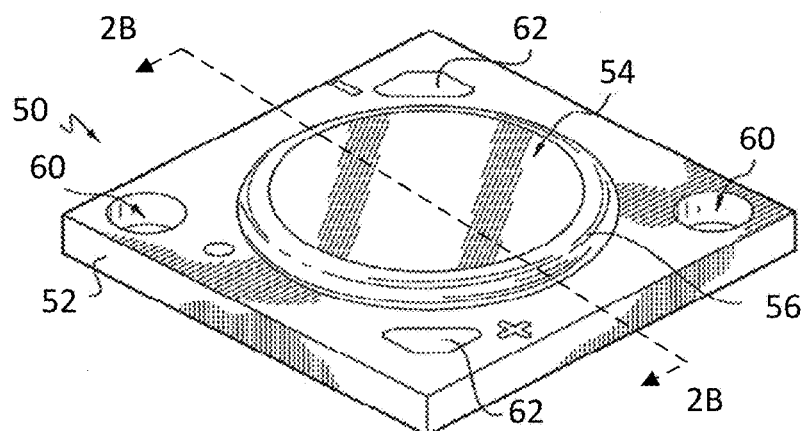
FIG. 2A is a top perspective view of a conventional COB LED device.
Figure 2B:
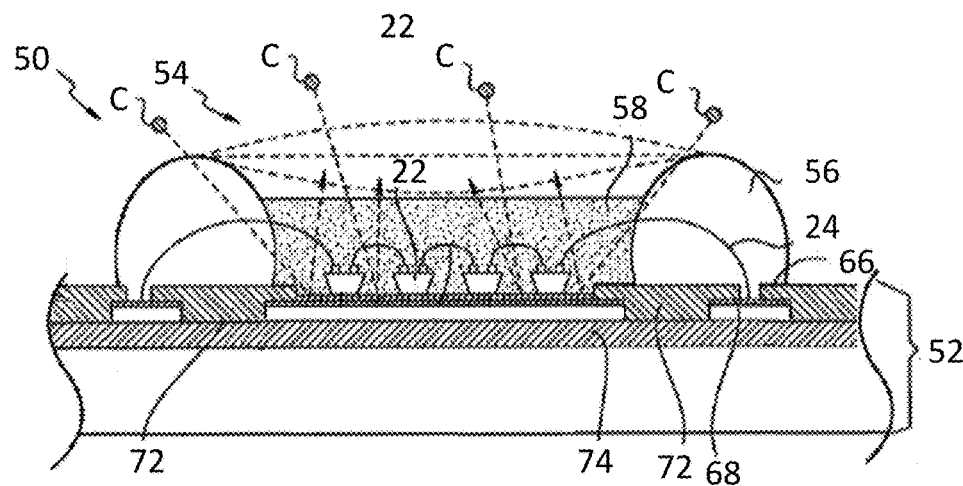
FIG. 2B is a sectional view of FIG. 2A, along section 2B-2B.

Referring now to FIGS. 2A and 2B, top perspective and cross-sectional views, respectively, of a conventional COB LED device, generally designated 50, is shown. Conventional LED device 50 can comprise a submount 52 with conductive layer or traces 74, over which a retention material or lens, generally designated 54, can be disposed. Retention material or lens 54 can comprise one or more LEDs 22 disposed under a filling material, such as an encapsulant 58. Retention material or lens 54 can comprise any suitable shape such as a substantially circular, square, oval, rectangular, diamond, irregular, regular, or asymmetrical shape. LED device 50 can further comprise a retention member 56 at least partially disposed about retention material or lens 54 where retention member 56 can be referred to as a dam. Retention member 56 can comprise any material such as a silicone, ceramic, thermoplastic, and/or thermosetting polymer material. In one aspect, retention member 56 is adapted for dispensing about retention material 54, which is advantageous as it is easy to apply and easy to obtain any desired size and/or shape.

Submount 52 of device 50 can comprise any suitable mounting substrate, for example, a printed circuit board (PCB), a metal core printed circuit board (MCPCB), an external circuit, a dielectric laminate panel, a ceramic panel, an Al panel, AlN, $Al_2O_3$, or any other suitable substrate over which lighting devices such as LEDs may mount and/or attach. LEDs 22 can electrically and/or thermally communicate with electrical elements disposed with submount 52, for example, conductive traces. Device 50 can comprise a plurality of LED chips, or LEDs 22 disposed within and/or below encapsulant 58 such as illustrated in FIG. 2B.

Referring to FIG. 2A, LED device 50 can comprise at least one opening or hole 60, that can be disposed through or at least partially through submount 52 for facilitating attachment of LED device 50 to an external substrate, circuit, or surface. LED device 50 can also comprise one or more electrical attachment surfaces 62. In one aspect, attachment surfaces 62 comprise electrical contacts such as solder contacts or connectors. Attachment surfaces 62 can be any suitable configuration, size, shape and/or location and can comprise positive and negative electrode terminals, denoted by the "+" and/or "−" signs on respective sides of device 50, through which an electrical current or signal can pass when connected to an external power source.

Electrical current or signal can pass into LED device 50 from the external wires (not shown) electrically connected to device 10 at the attachment surfaces 62. Electrical current can flow into the retention material 54 to facilitate light output from the LED chips disposed therein. Attachment surfaces 62 can electrically communicate with LEDs 22 of retention material 54 via conductive traces (not shown). Electrical connectors can comprise wire bonds 24 or other suitable members for electrically connecting LEDs 22 to conductive traces.

FIG. 2B further illustrates a cross-section along section 2B-2B of submount 52 over which LEDs 22 can be mounted or otherwise arranged.

As shown in FIG. 2B, encapsulant 58 can be disposed between inner walls of retention member 56. Encapsulant 58 can comprise a predetermined, or selective, amount of one or more phosphors and/or lumiphors in an amount suitable for any desired light emission. Moisture sensitive phosphors may be included in encapsulant 58. Encapsulant 58 can comprise a methyl and/or phenyl silicone material. In one example, encapsulant 58 is chemically different and/or functionally different with regard to chemical vapor and moisture vapor transport properties from the presently disclosed barrier coating.

Retention member 56 can be adapted for dispensing, positioning, damming, or placing, about at least a portion of lens 54. After placement of retention member 56, encapsulant 58 can be selectively filled to any suitable level within the space disposed between one or more inner walls of retention member 56. For example, filling material 58 can be filled to a level equal to the height of retention member 56 or to any level above or below retention member 56, for example, as indicated by the broken lines terminating at retention member 56 shown in FIG. 2B. The level of encapsulant 58 can be planar or curved in any suitable manner, such as concave or convex as shown by dotted lines in FIG. 2B.

FIG. 2B illustrates retention member 56 dispensed or otherwise placed over submount 52 after wire bonding the one or more LEDs 22 such that retention member 56 is disposed over and at least partially covers at least a portion of the wire bonds 24. A layer of material 68 can comprise a Ag or Ag-containing substrate adapted to increase brightness of device 50. One or more additional layers of material (not shown) can be disposed between layer 68 and conductive elements (not shown). Solder masks 66, 72 can also comprise reflective material to increase brightness of device 50.

Still referring to FIG. 2B, degradation of a conventional COB device components exists where undesirable chemical vapors "C" permeate the retention material/filling material/encapsulant 54, 58 of the device without the presently disclosed barrier coating, allowing chemical vapors "C" to permeate retention material 54 and/or encapsulant 58 leading to corrosion of corrodible metal materials and hydrolytic degradation of moisture sensitive phosphors.

Figure 2C:
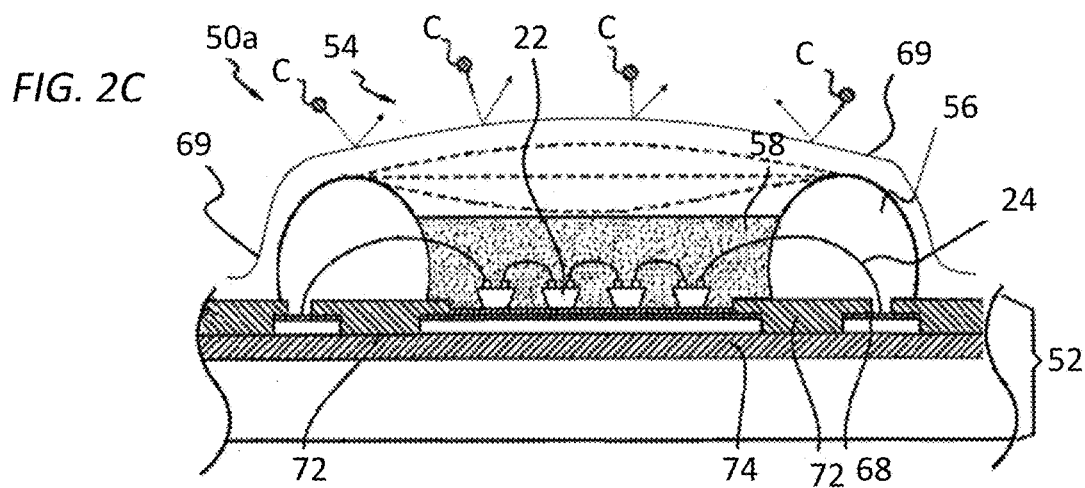
FIG. 2C is a sectional view of a COB LED device along section 2B-2B, with a barrier coating according to the disclosure herein.

As shown in FIG. 2C, a barrier coating 69 as presently disclosed, it is presented on an external surface of LED device 50a and is configured for providing chemical resistance. Barrier coating 69 can be at least partially disposed over and/or adjacent to lens 54, encapsulant 58 and retention member 56. Barrier coating 69 can be conformably disposed over and adjacent to lens 54, encapsulant 58 and retention member 56. Barrier coating 69 can be directly conformably disposed over retention material 54, encapsulant 58 and retention member 56.

As shown in FIG. 2C, barrier coating 69 provides a physical barrier for the Ag coated components, Ag, Al, or Ag or Al alloy components, or moisture sensitive components, from chemical vapors "C", thereby reducing or preventing such components from being physically, chemically, or electrically degraded via tarnishing, oxidizing, corroding, hydrolysis, or other degrading phenomenon otherwise caused when chemical vapors "C" permeate filling material 58 and/or retention member 54 as well as submount 52.

Barrier coating 69 can optionally extend over external surfaces of the aforementioned disclosed LED devices 10, 50a. The barrier coating 69 can be deposited discretely on one or more areas of the device 50a, for example, prior to mounting or bonding, so that electrical contacts are not coated or reduced in conductivity. For COB components, for example, barrier coating 69 is configured for deposition about device 50a using masking techniques, robotic dispensing, or other selective deposition processes, so as to avoid coating attachment surfaces 62 or hole 60 positioned on the upper surface of device 50a and to allow subsequent mounting or bonding after barrier coating 69 is applied.

In one aspect, an additional layer (not shown), such as layer P described above, is used in combination with remotely positioned barrier coating 69 in device 50a. The additional layer can be the same material as the barrier coating 69 or may be a different material. In one example, the additional layer comprises a polysiloxane polymer, a polysiloxane copolymer, a polysiloxane-polysilazane copolymer, a polyurethane, or mixtures thereof. The additional layer can comprise one or more materials as disclosed in co-assigned United States Patent Application Publication No. 2013/0020590A1, filed Dec. 1, 2011, the content of which is incorporated herein by reference. In one example, the additional layer is silicon nitride (SiN). The additional layer can comprise reflective material.

The additional layer can be discretely deposited on one or more components of the LED device 50, for example, using masking or robotic dispensing. The additional layer, in combination with the barrier coating 69, can then provide reflective functionality and/or provide additional chemical vapor and/or moisture barrier functionality to the LED device 50a.

In one example, the additional layer is deposited on at least a portion of one or more reflective components about device 50, and the barrier coating 69 is remotely positioned from the additional layer to provide device 50a. In another example, the additional layer is directly deposited on at least a portion of corrodible components about the submount or LED chips 22, and barrier coating 69 is remotely positioned from the additional layer. In another example, the additional layer is directly deposited on at least a portion of corrodible, reflective components about the submount or LED chips 22, and barrier coating 69 is remotely positioned from the additional layer.

The additional layer, if used, is deposited at a thickness suitable to reduce or eliminate exposure of corrodible metal components from chemical vapors or moisture vapor. Thus, in one example, the additional layer is deposited on one or more corrodible components on, in, or in proximity to the submount 52 or LED chips 22 of the LED device 50 so as to reduce or prevent corrosion by reducing or preventing permeation of chemical vapors or moisture vapor. In another example, the additional layer is deposited on at least a portion of corrodible, reflective components, for example Ag, Al, or Ag or Al alloys positioned about the device, but the additional layer is not deposited on the entirety on the floor of the substrate or the entirety of the device.

Barrier coating 69 can be disposed at discrete locations such that corrosive agents and/or water vapor can be repelled before permeating any portion of encapsulant 28, 58 or lens 54 and/or retaining member 56. Barrier coating 69 can be disposed above portions of encapsulant 28, 58 or lens 54/retaining member 56 such that corrosive agents and/or water vapor can be prevented from reaching Ag components or moisture sensitive components, thereby preventing any potential damage, corrosion, or darkening that may occur to the Ag components or chemical degradation to such phosphors. This can advantageously allow device 10, 50a to incur approximately zero, or minimal, brightness loss, corrosion of Ag-components, degradation of moisture sensitive phosphors, and/or Vf change during operation.

Notably, barrier coating 69 can be selectively applied at or parallel to any number of processing steps within the manufacturing process. In one example, barrier coating 69 can be applied before die attachment of LED and after encapsulation for providing broad protection against chemical vapors.

Notably, when a barrier coating 69 is incorporated, devices described herein can exhibit excellent chemical, including sulfur, resistance and long-lasting protection against chemical vapors "C" as compared to conventional devices. In one aspect, improved devices, such as device 10, can retain approximately 95% or more of its initial brightness value (e.g., measured in lumens) when exposed to a sulfur environment and or high relative humidity environments as compared to conventional devices, which may only retain approximately 60% or less of its initial brightness value or color when exposed to the same sulfur environment or high relative humidity (>85% relative humidity).

Depending on the level of sulfur present and severity of the environmental humidity, improved devices such as device 10 can retain approximately 100% of their initial brightness value, approximately 95% of their initial brightness value, approximately 90% of their initial brightness value, approximately 85% of their initial brightness value, approximately 80% of their initial brightness value up to or exceeding 1000 hours at operating amperage.

Barrier coating 69 can be applied as a coating having a thickness ranging from approximately 1 nm to 100 μm. Any sub-range of the barrier coating 69 thickness between approximately 1 nm and 100 μm is also contemplated herein, for example, thicknesses ranging between approximately 1 and 10 nm; 10 nm and 50 nm; 50 nm and 200 nm; 200 nm and 400 nm; 400 and 600 nm; 600 and 800 nm; 800 nm and 1 μm; 1 μm and 5 μm; 5 μm and 10 μm; 10 μm and 50 μm; and 50 μm and 100 μm are contemplated. Barrier coating 69 can also comprise a thickness ranging from approximately 1 nm to 100 nm, 100 nm to 500 nm, and 0.5 μm to 20 μm are also contemplated herein. In one aspect, a thin barrier coating 69, for example, less than 10 μm, can be employed so as can provide superior barrier protection of corrodible metal components against the aforementioned chemical vapors "C", without noticeable cracking of the thin coating during long-term use, thereby improving the brightness retention and/or lifetime of LED device 10.

Barrier coating 69 can be applied via any suitable technique, such as, for example and without limitation, spraying, spinning on, dispensing, micro-dispensing, brushing, painting, dipping, plating, screen-printing and/or chemical or physical vapor deposition (CVD or PVD) techniques. One or more additional processing techniques or steps can optionally be performed during manufacture of devices described herein for improving adhesion between one or more layers within the devices. Such optional processing steps can be used and applied to devices previously shown and described.

For example, such optional techniques can be performed to one or more surfaces prior to deposition or application of one or more adjacent surfaces within a device to facilitate acceptance of barrier coating 69. Techniques and/or optional processing steps can be performed on surfaces or layers, such as, for example and without limitation, surfaces of the conventional encapsulant, lens, or substrate/PCB. In one aspect, one or more of these surfaces can be physically, chemically, or thermally prepared or treated to improve adhesion between the treated surface and adjacent surface(s) or adjacent layer(s) and the barrier coating 69.

Optional processing steps that are physical in nature can comprise, for example and without limitation, sandblasting, plasma etching, brushing, lapping, sanding, burnishing, grinding, and/or any suitable form of surface roughening (e.g., physically texturizing the surface) to improve adhesion between one or more layers or surfaces within devices shown and the barrier coating 69 and described herein. Optional processing steps that are chemical in nature can comprise, for example and without limitation, chemical etching, applying solvents, applying organic solvents, applying acids, applying bases, vapor degreasing, priming, or any suitable chemically process for treating a surface to improve adhesion between one or more layers or surfaces within devices shown and described herein. Optional thermal processing steps can comprise, without limitation, prebaking, preheating, or any suitable thermal treatment that improves adhesion between one or more layers or surfaces within devices shown and described herein.

Transparent Corrosion Preventing Coating Composition Materials

The barrier coating of the present disclosure comprises a chemical structure capable of reducing or inhibiting corrosive and/or reactive gas or vapor influx at a coating thickness that otherwise does not significantly attenuate the overall luminous flux of the LED device. Thus, the barrier coating is transparent or substantially transparent to visible light. In one example, the transparent barrier coating composition comprises one or more oligomeric or polymeric curable precursors, such curable transparent composition and/or precursor components herein disclosed provide, among other things, a resultant, light transparent and optionally a low index of refraction, curable matrix. By "curable" it is meant the matrix attains essentially a non-flow state within the normal operating conditions of the LED device (heat and light flux range).

Suitable curable transparent compositions and/or one or more precursor components providing low index of refraction and/or highly visible light transparent organic polymers include a (poly)silane-derived, a (poly)siloxane-derived, a (poly)silazane-derived, hybrid inorganic/organic material, such as a polyester-silane, polyurethane-silane, polyacrylic-silane (e.g., polyacrylates-silanes, polymethacrylate-silanes, (hereafter "poly(meth)acrylate-silanes"), epoxy-silane, and combinations thereof. In one example, the transparent barrier coating composition comprises one or more elastomeric poly(methyl)acrylate-silanes.

In one aspect, the applied barrier coating is transparent in the visible spectrum (e.g., from about 400 nanometers to about 700 nanometers) and/or at least a portion of the UV region (e.g., from about 200 nanometers to about 400 nanometers). In other aspects, the applied barrier coating is transparent in the visible spectra and not transparent (e.g., substantially absorbing) in the UV region. Preferably, the applied barrier coating is at least 97% transparent in the visible spectra, or at least 98% transparent corresponding to the wavelength(s) of the LED light emitted from the package.

In certain aspects, the barrier coating is a one-part curable formulation. In another aspect, the barrier coating is a or two-part-curable formulation comprising one or more precursor components. The precursor component is any one or more precursors that are suitable for and capable of providing an optically transparent composition for use in a lighting device as set forth herein. In one aspect, the precursor component comprises one precursor. In another aspect, the precursor component is comprised of a "two-part composition".

Examples of cured or set matrixes formed from the one or more precursor components can further include, for example, one or more polymers and/or oligomers of silanes, poly(meth)acrylates, polysilicones, e.g., polysiloxanes (e.g., polydialkylsiloxanes (e.g., polydimethylsiloxane "PDMS"), polyalkylaryl siloxanes and/or polydiarylsiloxanes), epoxy resins, polyesters, polyarylesters, polyurethanes, cyclic olefinic copolymers (COC's), polynorbornenes, or hybrids and/or copolymers thereof, or such materials in combination with other components.

Examples of LED transparent barrier coating compositions include, without limitation, a mixture of a polymer structure represented by Formula (1):

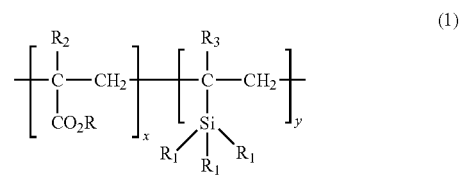

where R is methyl or ethyl or a $C_3$-$C_6$ straight or branched alkyl; each $R_1$ is, independently, hydrogen, hydroxyl, alkyl, phenyl, or vinyl, with the proviso that at least one $R_1$ is hydrogen, hydroxyl, or vinyl; $R_2$ and $R_3$ are, independently, hydrogen, methyl, or ethyl; and x and y represent molar amounts of monomer, where $0<x+y\leq1$, and $y>0$ arranged as a block copolymer, a random copolymer, or a silane end-terminated polymer. In one example, the molar percent of x+y=100, 95, 90, 85, 80, 75, 70, 65, 60, or 50 percent.

In one example, the barrier coating compositions include, without limitation, a mixture of polymerizable precursor components (2) and (3), which are polymerized or grafted to provide a copolymer. The copolymer produced from the polymerization or grafting of polymerizable precursor components (2) and (3) can be a block copolymer, a random copolymer, a graft polymer, or a silane end-terminated polymer of component (2).

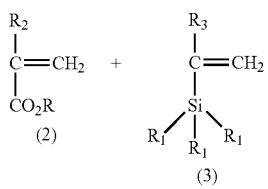

The polymer structure represented by Formula (1) can be prepared using free-radical-, UV-, acid-, heat-, metathesis- or condensation-polymerization of stoichiometric or non-stoichiometric molar amounts of at least polymerizable precursor components (2) and (3), as known in the art. In one example, the copolymer produced from the polymerization of polymerizable precursor components (2) and (3) can be of a number average molecular weight (Mn) of between about 1,000 to about 1,000,000 Daltons, as measured by HPLC techniques. The copolymer molecular weight can be unimodal or bimodal as determined by HPLC techniques. Average molecular weight of the polymer structure represented by Formula (1) can be chosen so as to provide a copolymer composition and structure suitable for spray, spin, or dip coating and that provides a suitable thickness upon curing having the requisite visible light transparency and chemical vapor barrier properties.

In one example, the polymer structure represented by Formula (1), or mixtures thereof, produced from polymerizable precursor components (2) and (3) is used, where at least one of the polymer structures represented by Formula (1) or of the mixture has $R_1$=hydrogen and at least one of the polymer structure represented by Formula (1) of the mixture has $R_1$=vinyl.

In one example, polymer structures represented by Formula (1), or mixtures thereof, produced from polymerizable precursor components (2) and (3) is used, where at least one of the polymer structures represented by Formula (1) of the mixture has $R_1$=hydroxyl. The mixture of one or more of the polymer structure represented by Formula (1) can constitute one part or two-part mixture suitable for dispensing as a coating.

One- or two part-curable precursor component(s) can be used. In one example, one- or two part-curable precursor component(s) can be used with solvents. In one example, one- or two part-curable precursor component(s) can be used with about 50 weight percent to about 95 weight percent solvent. In another example, one- or two part-curable precursor component(s) can be of low solvent content. In one example, the one- or two part-curable precursor component(s) are essentially solvent-free. Essentially solvent-free is inclusive of no solvent and trace amounts of low volatility components, where trace amounts of solvent are present, but at an amount less than 5 weight percent, less than 1 weight percent, and less than 0.5 weight percent.

In various aspects, precursor components comprise one or more reactive acrylate-silane containing polymers (and/or oligomers or formulations comprising same). Such one or more reactive functional groups can be mixed with non-reactive silicone or acrylate-silicone containing polymers. Examples of reactive acrylate containing polymers with reactive groups, include for example, linear or branched silanes containing at least one acrylate, methacrylate, acrylamide, methacrylamide, fumarate, maleate, norbornenyl and styrene functional groups, and/or linear or branched silanes with multiple reactive groups such as Si—H (silicon hydride), hydroxy, alkoxy, amine, chlorine, epoxide, isocyanate, isothiocyanate, nitrile, vinyl, and thiol functional groups. Some specific examples of such linear or branched acrylates with silane include hydride-terminated, vinyl-terminated or methacrylate-terminated. The reactive groups can be located at one or both terminuses of the reactive poly(meth)acrylates-silanes, and/or anywhere along the backbone and/or branches of the polymer.

In one aspect, one or more polymers and/or oligomers of poly(meth)acrylate-silane are used. The one or more polymers and/or oligomers of poly(meth)acrylates and silane comprising one or more functional groups selected from hydride, acrylate, methacrylate, acrylamide, methacrylamide, fumarate, maleate, norbornenyl and styrene functional groups. Some specific examples of such poly(meth)acrylates include silane-vinyl-terminated-, silane-hydroxyl-terminated, or silane-methacrylate-terminated poly(meth)acrylates. In one aspect, the functional group is located at one or both terminuses of the precursor component.

Additional substances in the aforementioned coating or one or more precursor components providing the barrier coating can be used, e.g., platinum catalyst, casting aids, defoamers, surface tension modifiers, functionalizing agents, adhesion promoters, crosslinking agents, viscosity stabilizers, other polymeric substances, and substances capable of modifying the tensile, elongation, optical, thermal, rheological, and/or morphological attributes of the precursor component or resulting coating.

Figure 3:
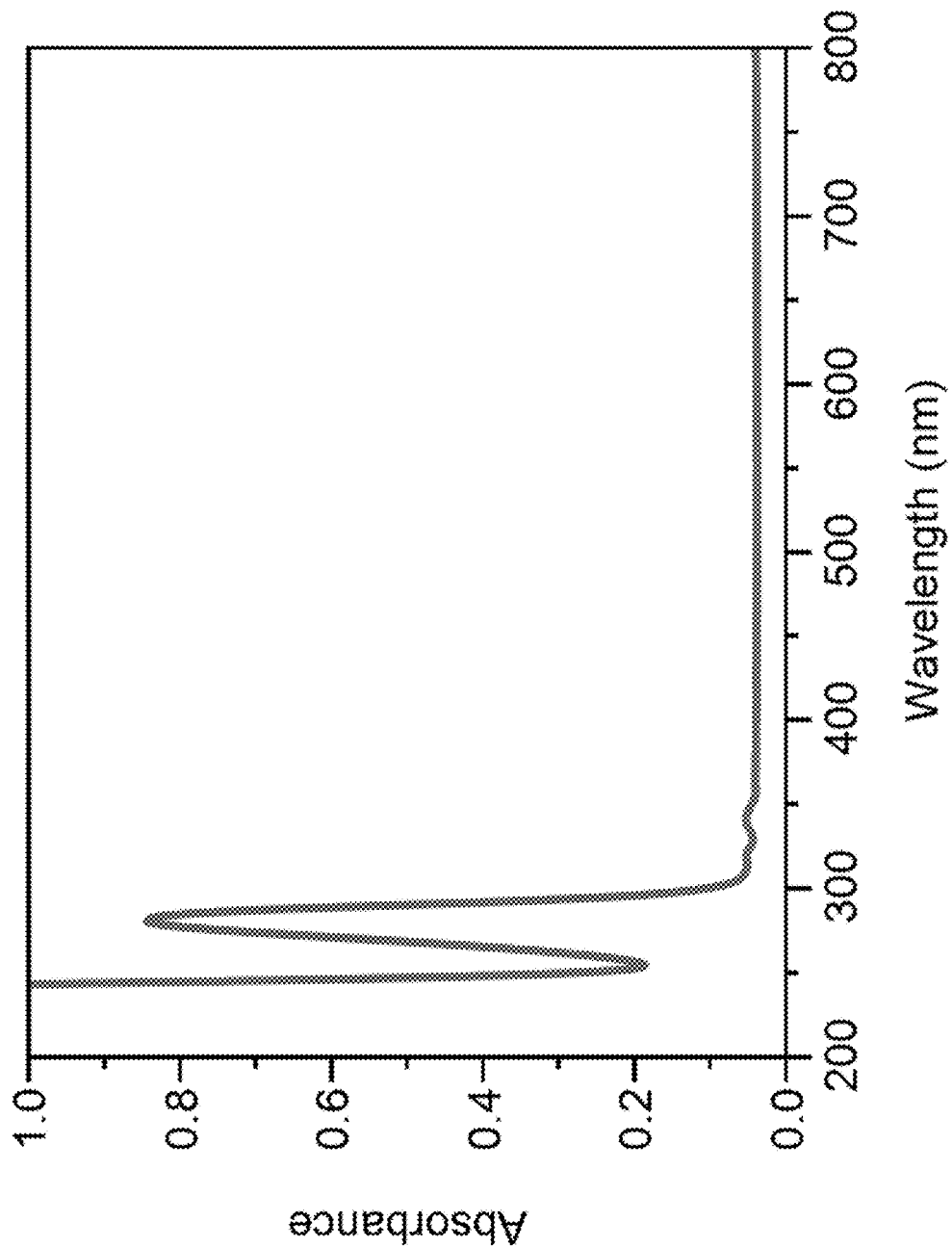
FIG. 3 depicts UV-Vis spectral data of an exemplary barrier coating according to the disclosure herein.
Figure 4:
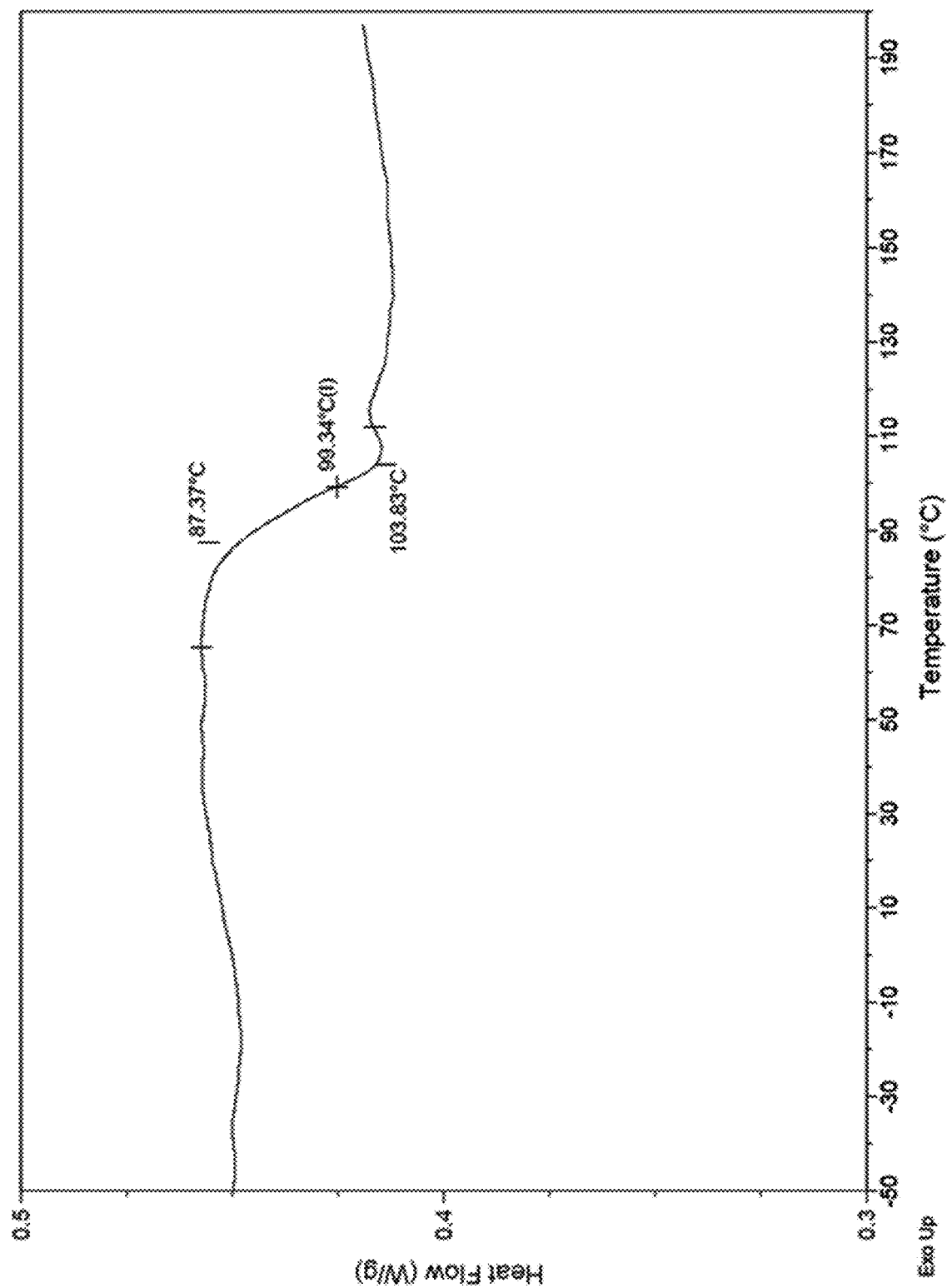
FIG. 4 depicts differential scanning calorimetry data of an exemplary barrier coating according to the disclosure herein.
Figure 5:
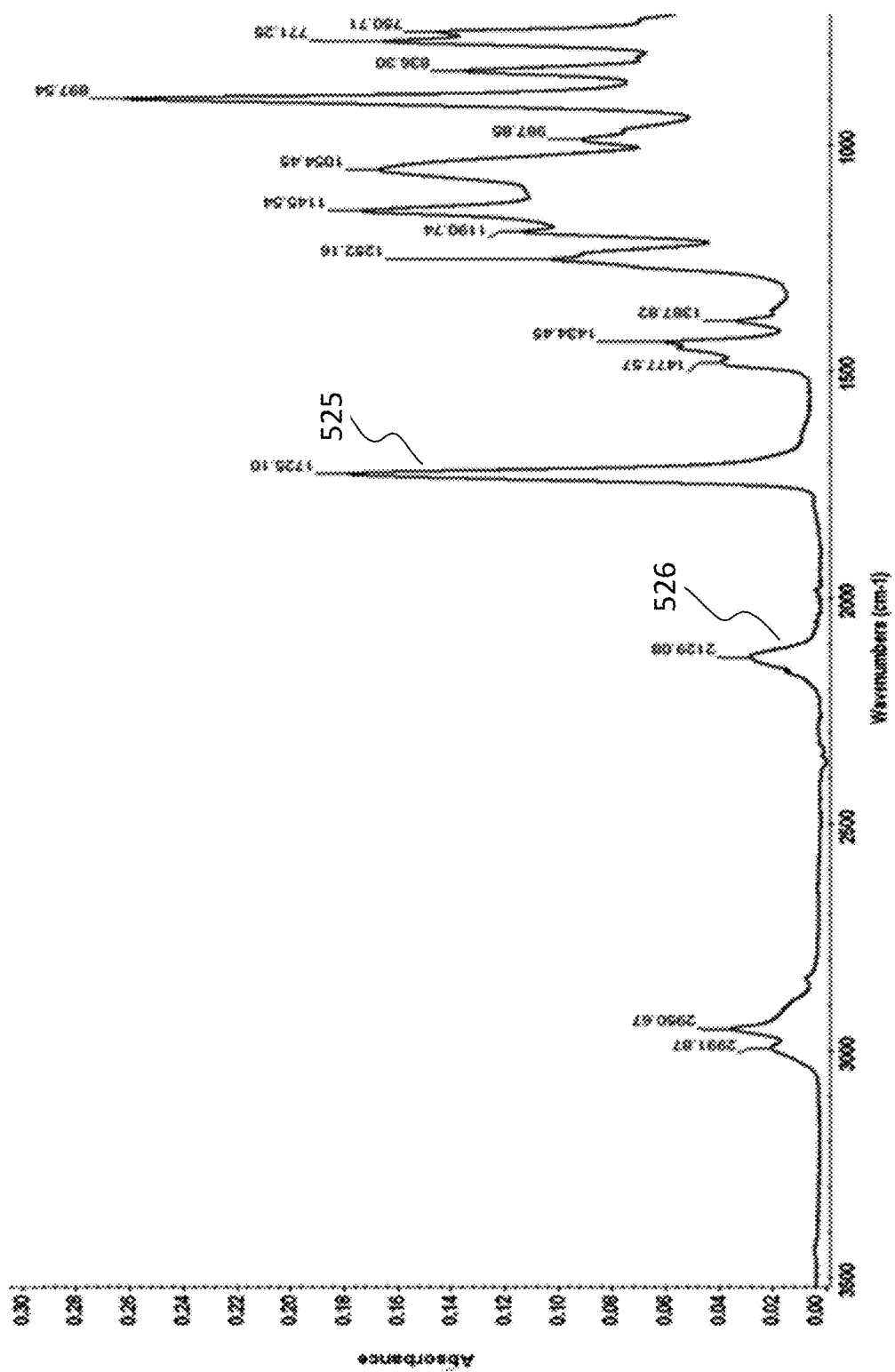
FIG. 5 depicts FT-IR spectral data of an exemplary barrier coating according to the disclosure herein.

FIGS. 3, 4, and 5 show UV-Vis spectra, differential scanning calorimetry, and FT-IR data, respectively, of an exemplary cured barrier coating 69. FIG. 3 shows the exemplary barrier coating 69 to be transparent in the visible region. FIG. 4 shows a glass transition at approximately 99° C. for the cured barrier coating 69. FIG. 5 indicates the presence of Si—H (526) and carbonyl groups (525) of a poly(meth)acrylate-silane polymer.

Additives

In one example, the presently disclosed barrier coating composition can contain one or more diffusive, reflective, notch-filtering materials, and/or fillers, as is known in the art. In another example, one or more viscosity stabilizers and/or dispensing aids are used in combination with the one or more precursor components, for example, to extend the useful life of the barrier coating prior to its application to the LED device or package. In one aspect, the viscosity stabilizer provides for a slow increase in viscosity of a curable one- or two-part-composition prepared in the course of coating a LED device or component. In one particular aspect, the viscosity stabilizer is specific for a platinum metal and/or rhodium noble metal catalyzed hydrosilation reaction between a Si-hydride and Si-vinyl functional groups. In one aspect, viscosity stabilizer and/or dispensing aide can include phosphines, phosphites, phosphinites, phosphonites, phosphinates, phosphonates, phosphates, arsines, stibenes, selenide, telluride chlorinated hydrocarbons that contain amines, hydroperoxy radical containing compounds, acetylenic compounds, maleates, dicarboxylates, and/or copper salts of naphthenic acid, alkynic or alkynl alcohols, allyl or other unsaturated compounds can also be used as viscosity stabilizers, ethyl acetate, vinyl acetate, monomers or polymers containing acetate, fumaric acid, vinyl siloxanes, divinyl siloxanes, tetramethyl divinyl disiloxane, pentamethyl vinyl disiloxane, compounds containing nitrides, amines or amides, nitriles, cyanates, oximo, nitroso, hydrazo, azo compounds, compounds containing tin, fatty acid tin salts, such as those used in tin-catalyzed silicone release coatings; as well as general compounds, pigments, fillers, additives; minerals that contain compounds listed previously; pigments that contain compounds listed previously; fillers such as silica, titanium oxide, aluminum oxide, alumina, titania, calcium carbonate containing compounds listed previously; sodium salts, such as sodium alginate or carboxymethylcellulose sodium salt, clays or binders that use polyvinylacetate or acrylics, anti-slip, antioxidant or other additives containing compounds listed previously, polyvinylacetate; polyvinylacetate/acrylic; and the like.

The present compositions, if containing Si—H/Si-vinyl groups or Si—OH groups, can be catalyzed by a platinum and/or rhodium catalyst components, which can be all of the known platinum or rhodium catalysts which are effective for catalyzing the reaction between silicon-bonded hydrogen groups and silicon-bonded olefinic groups or silanol groups.

Notably, devices and components herein can incorporate poly(meth)acrylate-silanes which are optimized with respect to application and/or curing techniques and adapted for use in LED devices described herein to provide excellent chemical resistance against undesired chemicals, chemical vapors, or chemical complexes which can tarnish, corrode, or adversely affect components and brightness of LED devices.

Coating Methods

One or more coating processes can be used to deposit the barrier coating 69 onto the LED device or package, for example, a spray process dip, a cascade coating, a spray process in combination with a spray coating, etc. In one aspect, a second spray coating process can provide for one or more "coats" deposited on a first coating that was previously deposited so as to provide a defined thicker coating about the portions of the LED lamp, package, or leadframe, for example, that would benefit from additional coating thickness, such sections having thicker coating would have improved corrosion prevention performance for the specific portion or region of the LED lamp, package, or leadframe.

Figure 6:
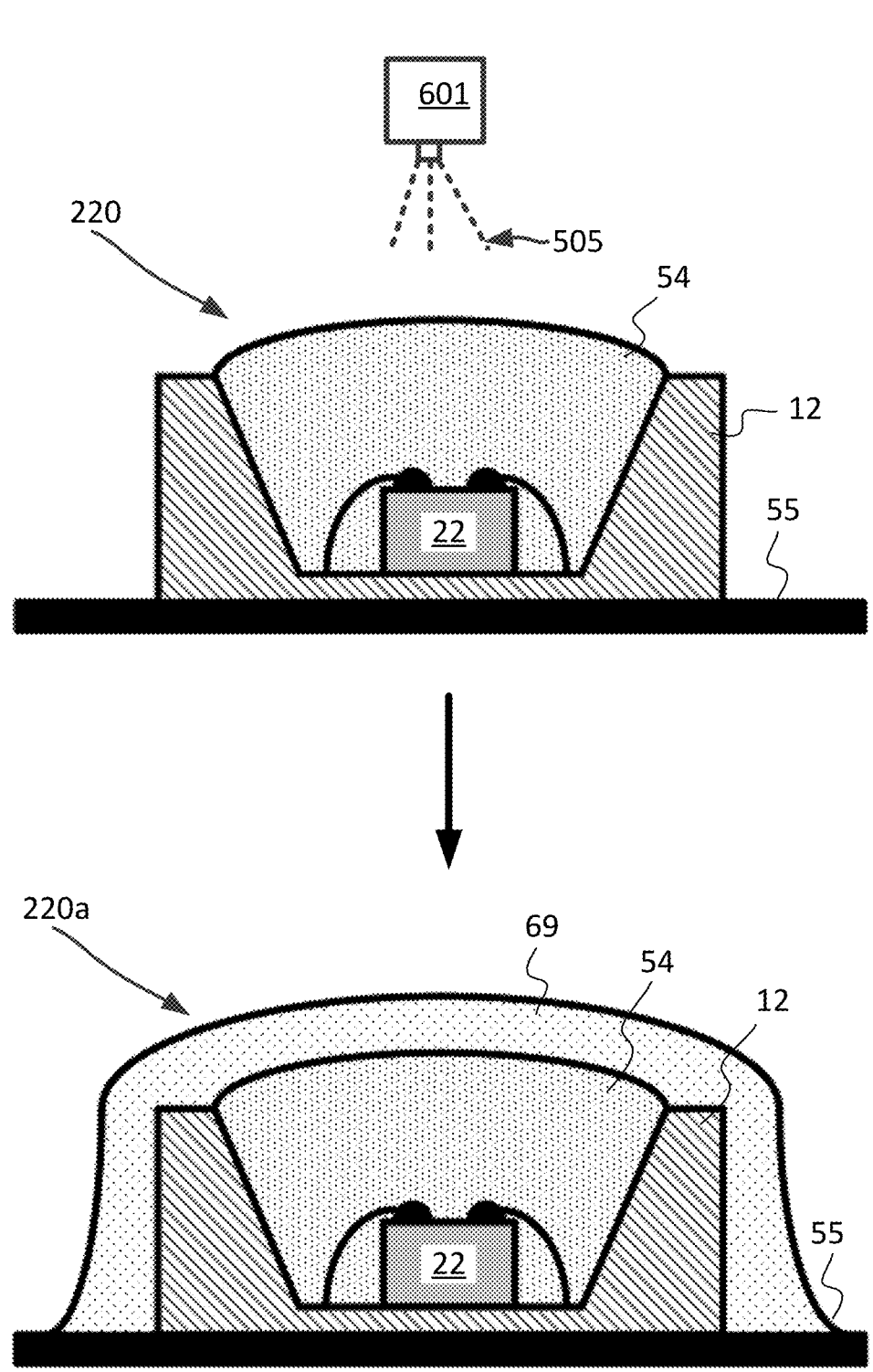
FIG. 6 depicts an exemplary coating process according to the disclosure herein.

FIG. 6 is an exemplary coating process of a LED package 220 mounted on leadframe 55 in accordance with embodiments of the present disclosure. As shown, spraying unit 601 dispenses curable transparent barrier coating 505 to LED package 220 mounted on leadframe 55 (or PCB) comprising LED chip 22 and encapsulant 54. LED package 220a is provided with conformal barrier coating 69. Barrier coating 69 extends onto substrate/submount 55 (or PCB). In one example barrier coating 69 extends continuously over LED package 220a and substrate/submount 55 (or PCB). As shown, encapsulant 54 is spatially closer to LED 22 than barrier coating 69, thus, barrier coating 69 is remotely positioned from LED chip 22 as well as remotely positioned from encapsulant 54 relative to the position of the LED chip 22. In one example, using a spray coating, the barrier coating 69 can be provided with a thin coating thickness, e.g., 0.5 μm-10 μm. Thus, while functioning as a chemical and/or moisture barrier, the present barrier coating will have minimal effect on the luminous flux (Lf; minimal dimming). and the reduced thickness of the barrier coating via spray coating lessens the tendency of the barrier coating to cracking over prolonged use at operating conditions.

After the barrier coating composition are deposited on the LED divisor package, the coating can be cured. The cure process can be accelerated, by using heat and/or light to initiate and/or accelerate the cure, and/or curing by catalyst.

Experimental Results

Figure 7:
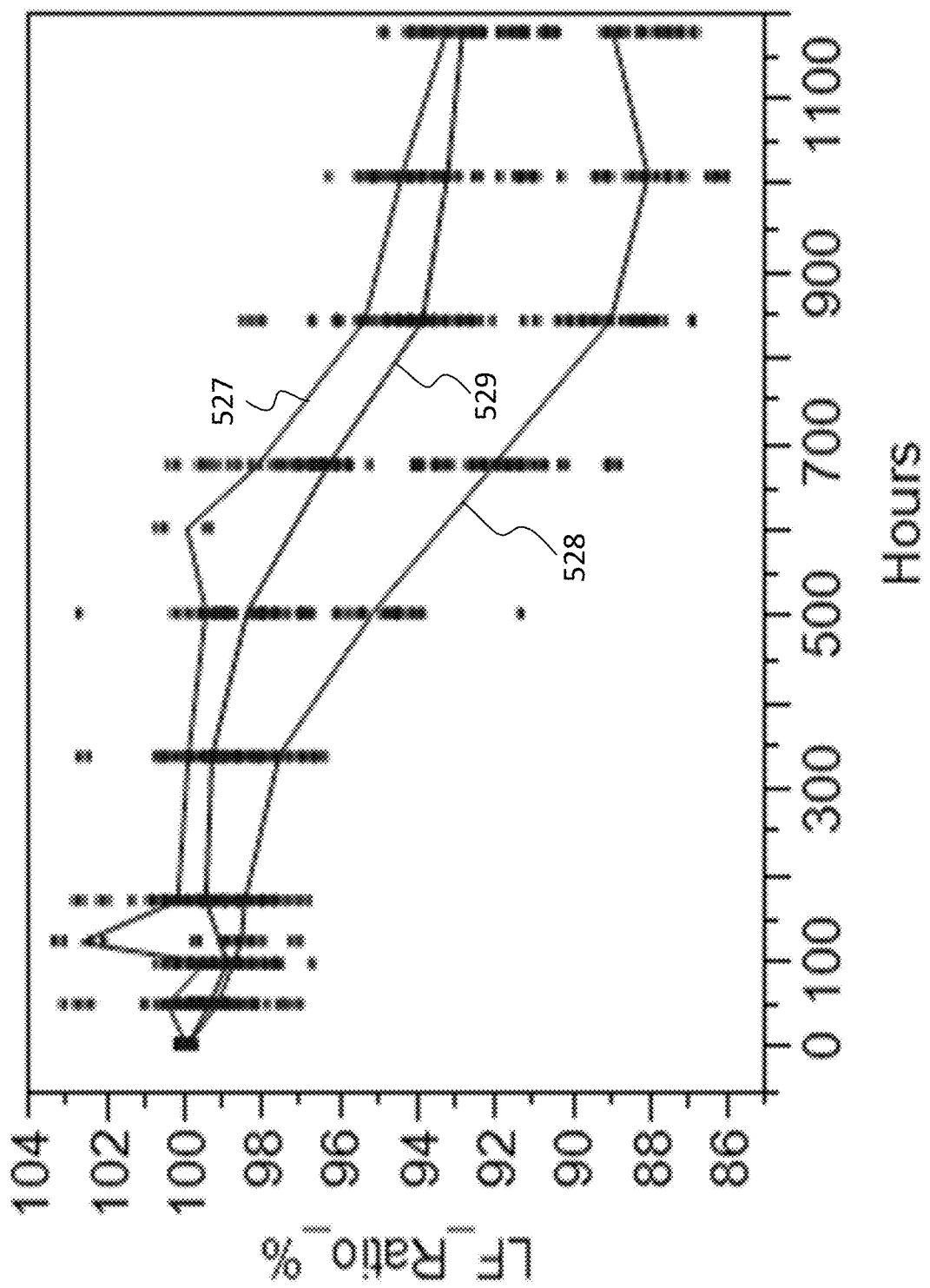
FIG. 7 depicts experimental stress data of luminous flux ratio versus time (hours) of a remotely positioned barrier coated device according to the disclosure herein.
Figure 8:
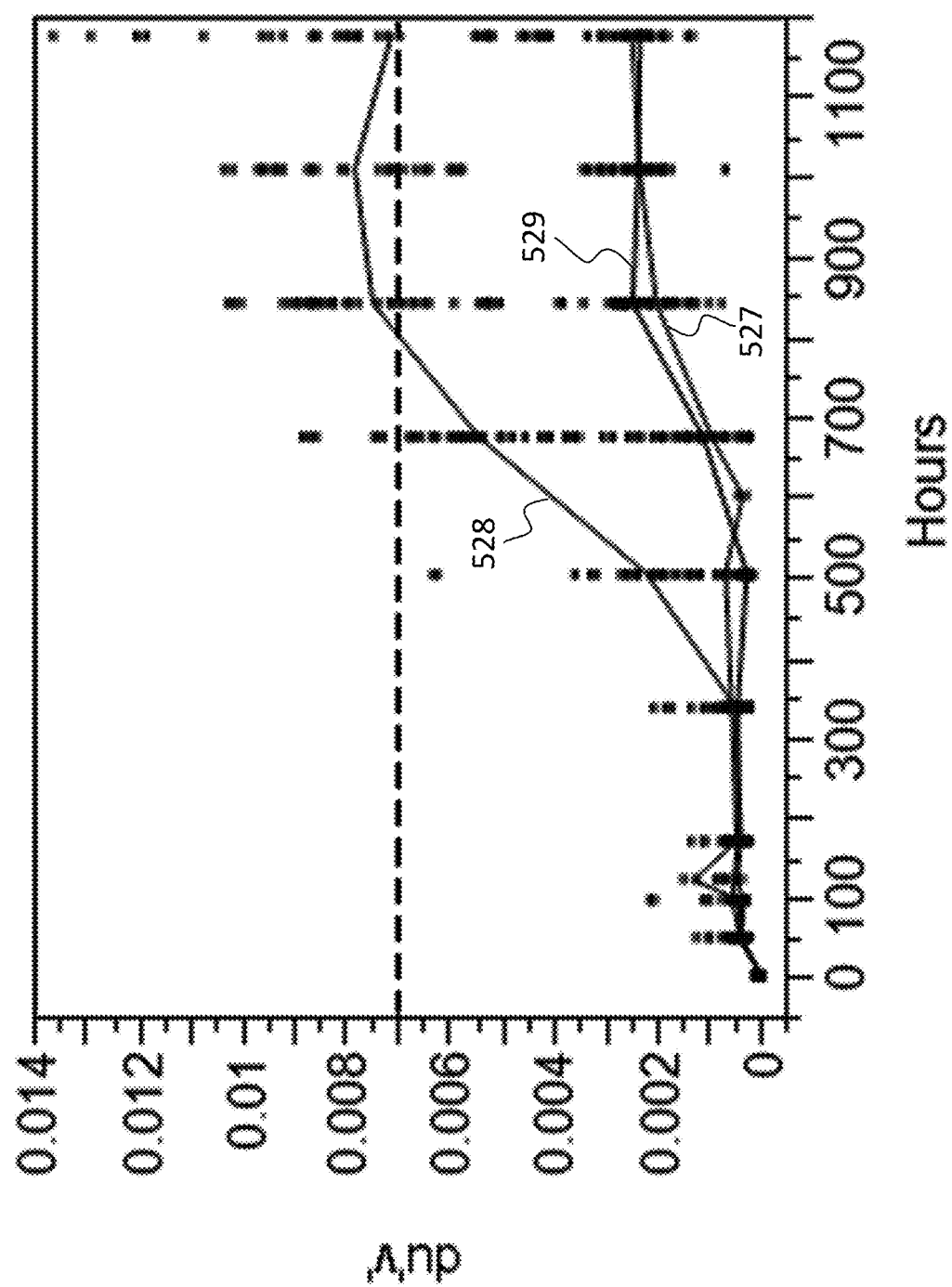
FIG. 8 depicts experimental stress data of color shift versus time (hours) of a remotely positioned barrier coated device according to the disclosure herein.

As shown in FIGS. 7 and 8, remote application of the remotely applied barrier coating 69 was performed and compared with a directly coated LED controls under stress conditions. FIG. 7 shows the luminous flux ratio percent change versus hours of control sample 527 (with no barrier), the presently disclosed barrier coating 529 (remotely applied over an encapsulant or lens), and barrier coating 528 (deposited directly on the LED chip. The test samples were maintained at 105° C. with a current of 300 mA. The data obtained from these LEDs demonstrate that the remotely applied barrier coating 69 of sample 529 demonstrated superior temperature and UV exposure resistance to a greater extent (less reduction in LF ratio %) than directly coated LEDs.

With reference to FIG. 8, color shift change under identical conditions discussed above shows the remote barrier coating 69 (sample 529) advantageously outperformed coatings directly applied to the LED (sample 528). The data of FIGS. 7 and 8 demonstrates that coating the LED package rather than coating directly inside the package, or on or around individual LEDs, provides improved performance. The data of FIGS. 7 and 8 also demonstrate the presently disclosed barrier coating remains optically transparent and stable under exposure to blue LED light. The more remote positioning of barrier coating 69 reduces the photon density and heat from the LEDs and provides favorable optical stability to the coating, and when combined with its barrier properties, advantageously improves performance of the LED device or package.

Figure 9:
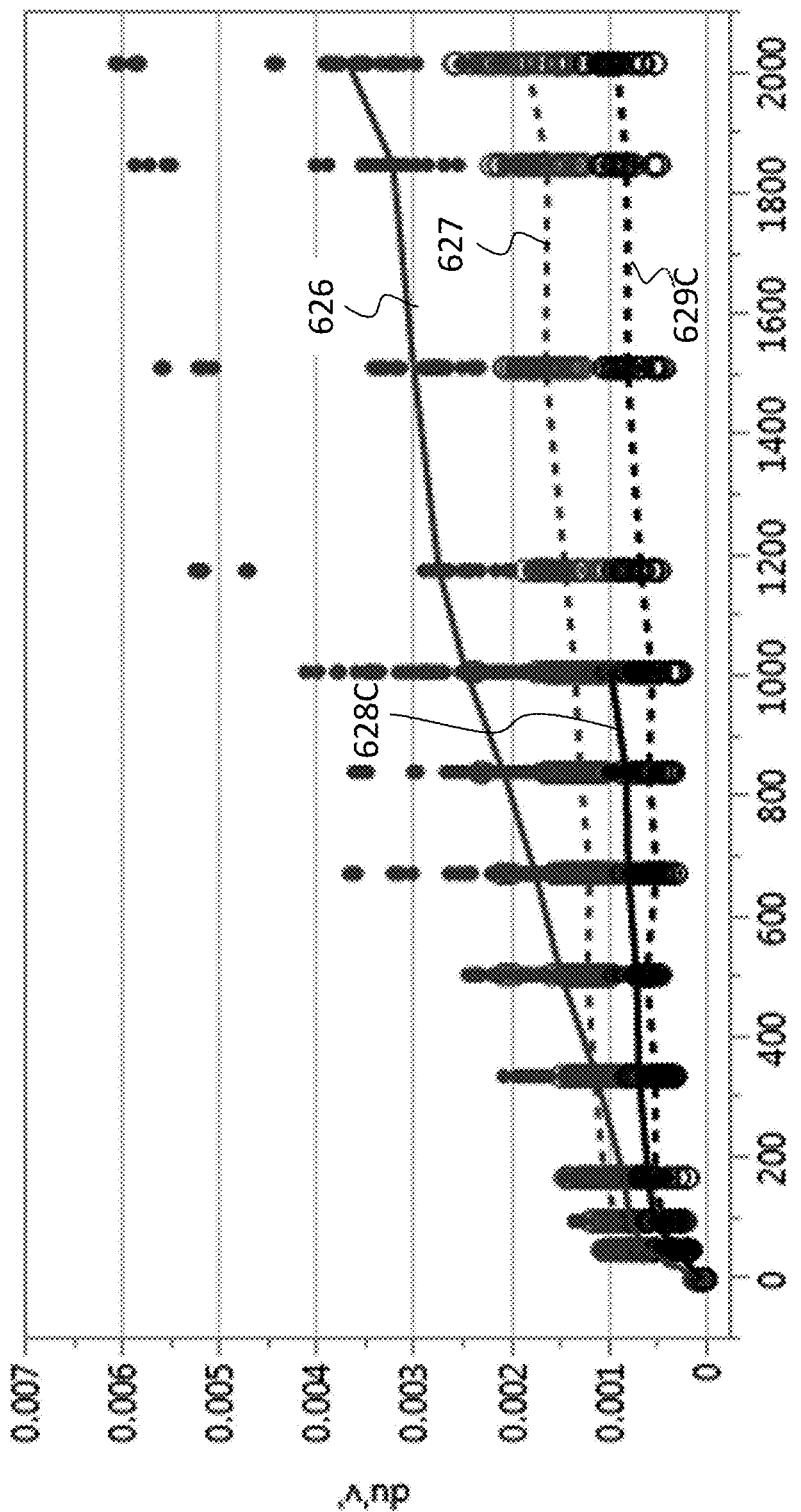
FIG. 9 depicts experimental WHTOL data of color shift ratio versus time (hours) of a remotely positioned barrier coated device according to the disclosure herein.
Figure 10:
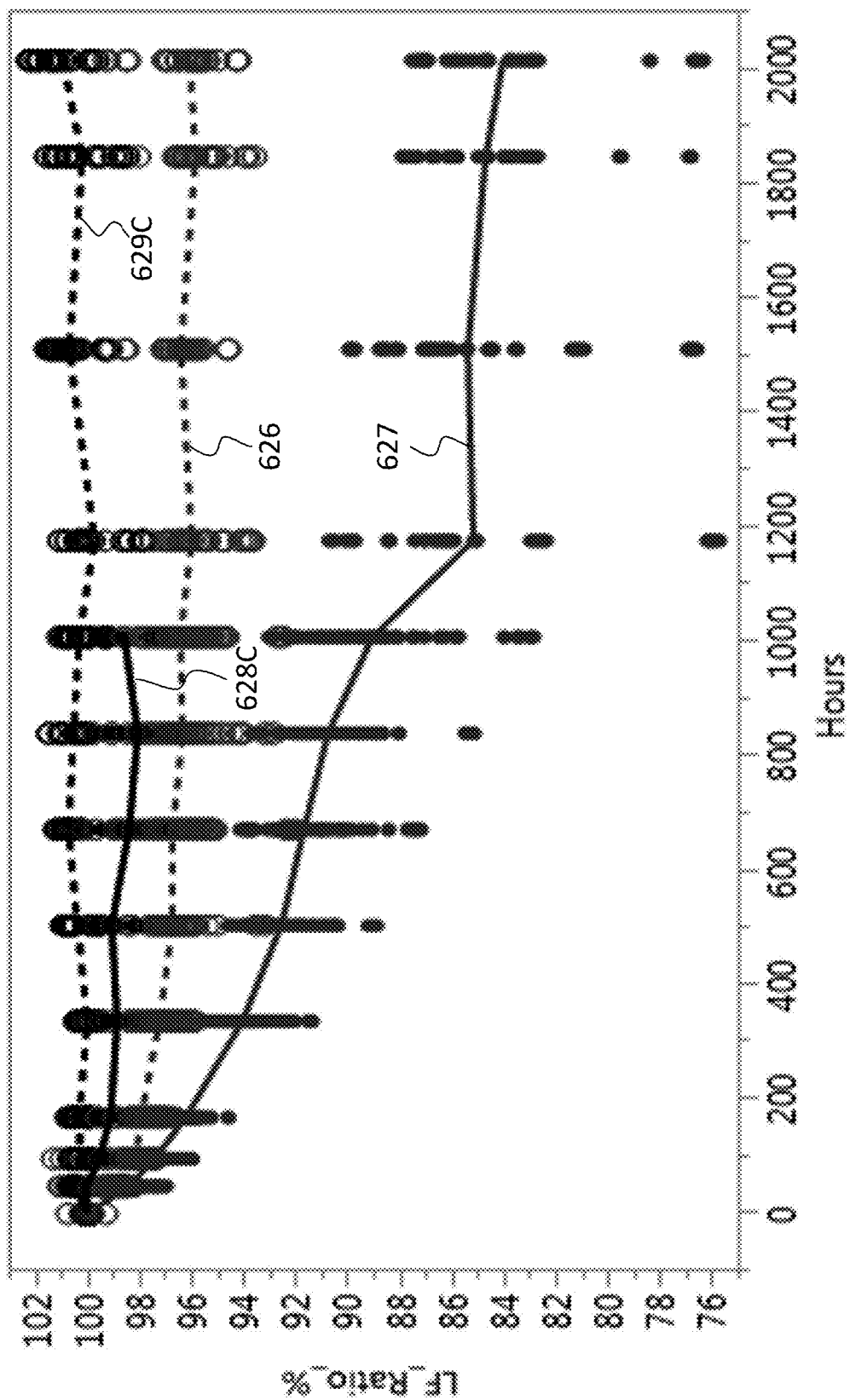
FIG. 10 depicts experimental WHTOL data of luminous flux versus time (hours) of a remotely positioned barrier coated device according to the disclosure herein.

With reference to FIGS. 9 and 10, the effect of the barrier coating in providing protection to moisture sensitive phosphors is shown. LED device or package comprising a moisture sensitive potassium fluorosilicate phosphor (KSF) was tested versus controls under the Wet High Temperature Operating Life Test (WHTOL) of JES-022 Method A101-C (high humidity (85% relative humidity) and 85° C.). FIG. 9 shows bivariate plots of color shift (du'v') over time (hours) of sample 627 (a LED package with a moisture sensitive phosphor) with the barrier coating of the present disclosure versus sample 626 (the LED package with the moisture sensitive phosphor without barrier coating), and two controls, 628C (the LED package with a non-moisture sensitive phosphor) and sample 629C (the LED package with a non-moisture sensitive phosphor with the barrier coating of the present disclosure).

The data of FIG. 9 shows sample 627, with the presently disclosed barrier coating 69 and moisture sensitive phosphor displaying superior resistance to change in color shift under high humidity, high temperature conditions versus sample 626 without the barrier coating and with moisture sensitive phosphor, and being comparable in color shift change performance to that of control samples 628C, 629C. Thus, the data of FIG. 9 shows the presently disclosed barrier coating provides for a reduction in moisture-related degradation of moisture sensitive components, such as, KSF phosphors.

FIG. 10 displays bivariate plots of change in luminous flux ratio percent (LF_Ratio_%) over time (hours) of the same samples used and displayed in FIG. 9. Thus, the data of FIG. 10 shows sample 626, having the presently disclosed barrier coating with moisture sensitive phosphor, provides improved luminous flux retention over time under high humidity, high temperature conditions and is comparable with controls 628C, 629C, whereas sample 627 (with moisture sensitive phosphor without the barrier) shows noticeable decrease in luminous flux retention over time under identical conditions.

Figure 11:
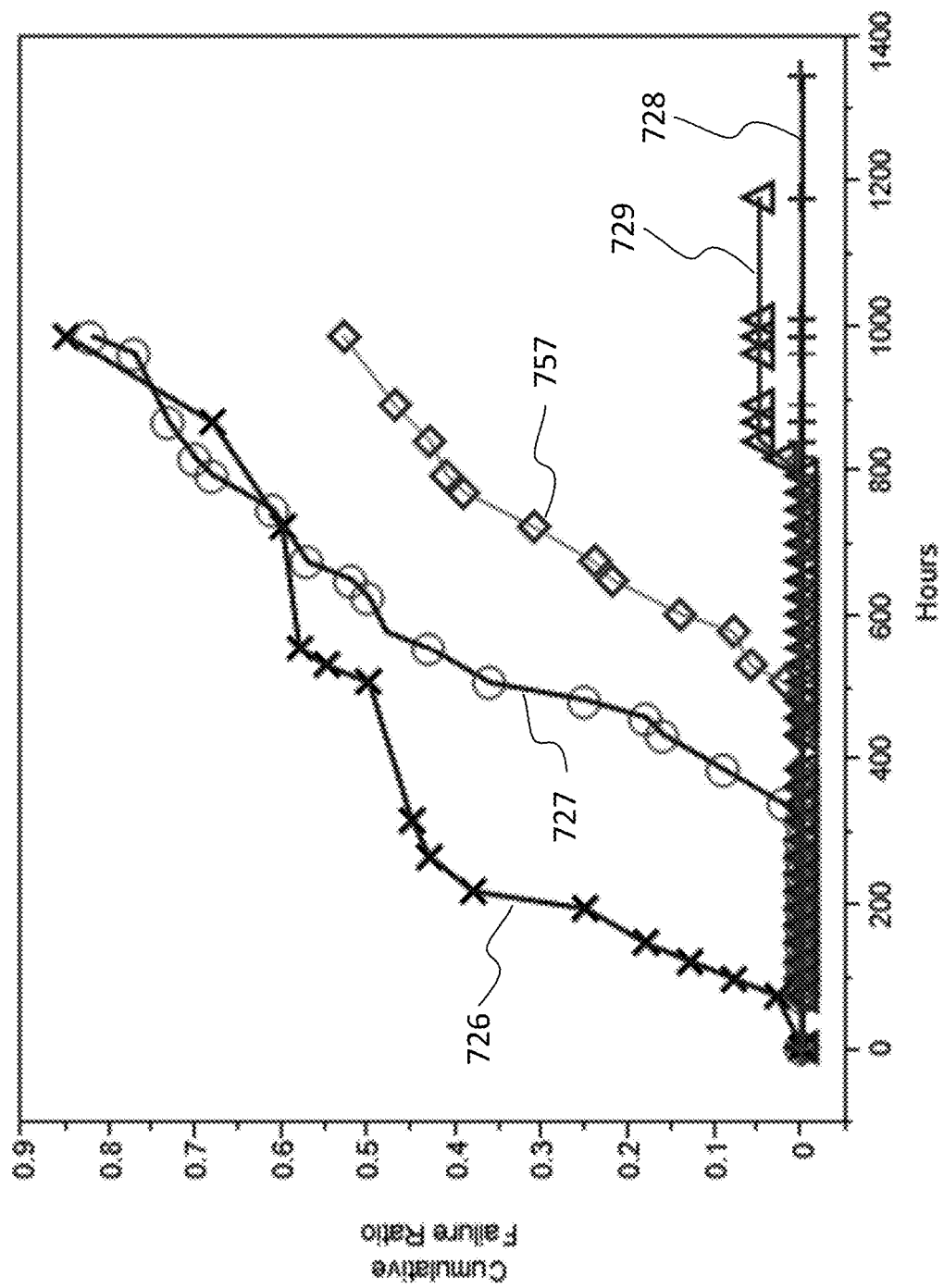
FIG. 11 depicts experimental cumulative failure ratio data of luminous flux ratio versus time (hours) of a remotely positioned barrier coated device according to the disclosure herein.

With reference to FIG. 11, cumulative failure ratio data versus time plots representing sulfur resistance at 50° C. and 65 mA bias, with 15 ppm $H_2S$ are shown for a number of samples including a sample comprising the barrier coating of the present disclosure. Failure is defined as more than a 10% rise in forward voltage (Vf). Sample 726 represents an example LED package having corrodible silver portions without any barrier coating. Sample 727 represents another example LED package having corrodible silver portions without any barrier coating. Sample 757 represents a commercially available product (Nichia 757) considered to have good sulfur resistance as a comparative example. Sample 729 represents a control (same LED package as sample 726) with non-corrodible portions (gold). The data shows sample 728 provides a reduction in cumulative failure ratio compared to sample 727 (same LED package) when the barrier coating of the present invention is used. This data clearly shows the advantage of the presently disclosed barrier coating for providing improved sulfur resistance to LED packages containing corrodible metal portions, such as silver. Likewise, it can be extrapolated from the present data that the presently disclosed barrier coating provides for both improving sulfur resistance and reducing moisture degradation of moisture sensitive components.

Embodiments of the present disclosure shown in the drawings and described above are exemplary of numerous embodiments that can be made within the scope of the appended claims. It is contemplated that the configurations of LED devices optimized for chemical resistance and methods of making the same can comprise numerous configurations other than those specifically disclosed, including combinations of those specifically disclosed.

We claim:

1. An LED device comprising:
one or more LED chips;
an encapsulant material or lens disposed over at least a portion of the one or more LED chips; and
a barrier coating at least partially disposed over the encapsulant or lens, wherein the barrier coating comprises a polyacrylate-silicon containing material, a polymethylacrylate-silicon containing material, or mixtures thereof represented by Formula (1):

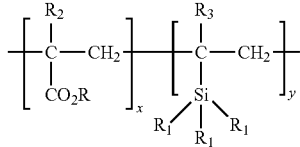

(1)

where R is methyl or ethyl or a $C_3$-$C_6$ straight or branched alkyl; each $R_1$ is, independently, hydrogen, hydroxyl, alkyl, phenyl, or vinyl, with the proviso that at least one $R_1$ is hydrogen, hydroxyl, or vinyl; $R_2$ and $R_3$ are, independently, hydrogen, methyl, or ethyl; and x and y represent molar amounts of monomer, where $0<x+y\leq1$, and $y>0$ arranged as a block co-polymer, a random copolymer, a graft copolymer, or a silane end-terminated polymer.

2. The device of claim 1, wherein the barrier coating is directly disposed on the encapsulant material or the lens.

3. The device of claim 1, further comprising one or more corrodible metal components selected from silver (Ag), aluminum (Al), copper (Cu), or alloys thereof.

4. The device of claim 1, further comprising a corrodible metal component comprising silver (Ag).

5. The device of claim 1, further comprising one or more reflective metal components selected from silver (Ag), aluminum (Al), or alloys thereof.

6. The device of claim 5, further comprising a reflective metal component comprising silver (Ag).

7. The device of claim 1, wherein the LED device comprises an element or compound sensitive to moisture or water vapor.

8. The device of claim 7, wherein the element or compound is a potassium fluorosilicate.

9. The device of claim 1, wherein the barrier coating is a mixture of polymer structures represented by Formula (1), where at least one of the polymer structures represented by Formula (1) of the mixture has $R_1$=hydrogen and at least one of the polymer structures represented by Formula (1) of the mixture has $R_1$=vinyl.

10. The device of claim 1, wherein the barrier coating is a polymer structure represented by Formula (1), where $R_1$=hydroxyl.

11. The device of claim 4, further comprising an additional layer deposited on at least a portion of the corrodible metal component, wherein the lens or the encapsulant is positioned between the additional layer and the barrier coating.

12. The device of claim 10, wherein the additional layer comprises one or more reflective materials.

13. The device of claim 10, wherein the additional layer is the same material as the barrier coating.

14. A method of reducing or preventing corrosion of corrodible metal components of an LED device, the method comprising:
applying a barrier coating to at least a portion of an encapsulant or lens of an LED device, the LED device having at least one corrodible metal portion, wherein the barrier coating comprises a polyacrylate-silicon containing material, a polymethylacrylate-silicon containing material, or mixtures thereof represented by Formula (1):

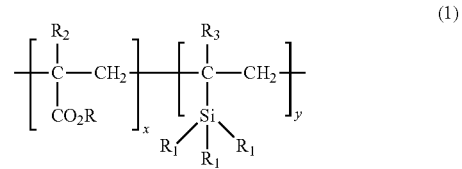

(1)

where R is methyl or ethyl or a $C_3$-$C_6$ straight or branched alkyl; each $R_1$ is, independently, hydrogen, hydroxyl, alkyl, phenyl, or vinyl, with the proviso that at least one $R_1$ is hydrogen, hydroxyl, or vinyl; $R_2$ and $R_3$ are, independently, hydrogen, methyl, or ethyl; and x and y represent molar amounts of monomer, where $0<x+y\leq1$, and $y>0$ arranged as a block co-polymer, a random copolymer, a graft copolymer, or a silane end-terminated polymer; and
reducing or preventing permeation of one or more chemicals capable of corroding the at least one corrodible metal portion.

15. The method of claim 14, wherein the barrier coating is applied directly to the encapsulant or the lens.

16. The method of claim 14, further comprising reducing or preventing: a change of forward voltage (Vf) during operating conditions of the LED device or package; a change of luminosity during operating conditions of the LED device; or reducing or preventing a change of color shift during operating conditions during operating conditions of the LED device.

17. The method of claim 14, wherein the corrodible metal portion comprises silver (Ag).

18. The method of claim 14, wherein the corrodible metal portion comprises a reflective metal.

19. The method of claim 14, wherein the reflective metal comprises silver (Ag).

20. The method of claim 14, further comprising an additional layer positioned between the additional layer and the barrier coating, the additional layer reducing or preventing permeation of at least one of the one or more chemicals.

21. The method of claim 20, wherein the additional layer comprises an amount of one or more reflective materials capable of reflecting light produced by the LED device.

22. The method of claim 20, wherein the additional layer is the same material as the barrier coating.

\* \* \* \* \*

UNITED STATES PATENT AND TRADEMARK OFFICE
CERTIFICATE OF CORRECTION

PATENT NO. : 11,056,625 B2
APPLICATION NO. : 15/899196
DATED : July 6, 2021
INVENTOR(S) : Francis et al.

Page 1 of 1

It is certified that error appears in the above-identified patent and that said Letters Patent is hereby corrected as shown below:

In the Claims

Column 24, Line 13, Claim 12: Please correct "claim 10" to read -- claim 11 --

Column 24, Line 15, Claim 13: Please correct "claim 10" to read -- claim 11 --

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*